US010924003B2

(12) United States Patent
Maejima

(10) Patent No.: US 10,924,003 B2
(45) Date of Patent: Feb. 16, 2021

(54) SWITCHING POWER SUPPLY

(71) Applicant: Rohm Co., Ltd., Kyoto (JP)

(72) Inventor: Satoshi Maejima, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 16/272,087

(22) Filed: Feb. 11, 2019

(65) Prior Publication Data

US 2019/0260290 A1 Aug. 22, 2019

(30) Foreign Application Priority Data

| Feb. 19, 2018 | (JP) | JP2018026811 |
| Feb. 19, 2018 | (JP) | JP2018026815 |
| Oct. 30, 2018 | (JP) | JP2018203970 |

(51) Int. Cl.
*H02M 1/42* (2007.01)
*H02M 1/32* (2007.01)
*H02M 1/36* (2007.01)

(52) U.S. Cl.
CPC ........... *H02M 1/4225* (2013.01); *H02M 1/32* (2013.01); *H02M 1/36* (2013.01)

(58) Field of Classification Search
CPC ........ H02M 1/4225; H02M 1/42–1/44; H02M 1/36; H02M 2001/0009
See application file for complete search history.

(56) References Cited

U.S. PATENT DOCUMENTS

| 8,174,855 | B2 * | 5/2012 | Ribarich | ............... G05F 1/70 363/89 |
| 2007/0085517 | A1 | 4/2007 | Ribarich et al. | |
| 2008/0290846 | A1 * | 11/2008 | Kanouda | ............ H02M 1/4225 323/222 |
| 2019/0181859 | A1 * | 6/2019 | Wibben | ................. H02M 1/08 |

FOREIGN PATENT DOCUMENTS

| CN | 101841242 A | 9/2010 |
| CN | 102710125 A | 10/2012 |
| CN | 102790520 A | 11/2012 |
| CN | 107017777 A | 8/2017 |
| JP | 2014-233110 | 12/2014 |
| WO | WO2016075720 A1 | 5/2016 |

* cited by examiner

*Primary Examiner* — Peter M Novak
(74) *Attorney, Agent, or Firm* — Fish & Richardson P.C.

(57) ABSTRACT

A controller IC has, for example, a current detection terminal for detecting a coil current passing in a switching power supply and an on-timing setter configured to check for a ground short circuit at the current detection terminal when an output transistor turns off to generate an on-timing setting signal so as to turn on the output transistor, during normal operation, at the time point that the coil current has decreased to a zero value or a value close thereto and, during a ground short circuit, after the lapse of a predetermined minimum off-period.

9 Claims, 12 Drawing Sheets

SWITCHING POWER SUPPLY

CROSS-REFERENCE TO RELATED APPLICATIONS

This application is based on the following Japanese Patent Applications, the contents of which are hereby incorporated by reference:
(1) Japanese Patent Application published as No. 2018-026811 (filed on Feb. 19, 2018)
(2) Japanese Patent Application published as No. 2018-026815 (filed on Feb. 19, 2018)
(3) Japanese Patent Application published as No. 2018-203970 (filed on Oct. 30, 2018)

BACKGROUND OF THE INVENTION

1. Field of the Invention

The invention disclosed herein relates to switching power supplies.

2. Description of Related Art

Conventionally, switching power supplies that generate a desired output voltage from an input voltage are in practical use as power supplying means in various applications.

An example of the just-mentioned conventional technology is seen in Japanese Patent Application published as No. 2014-233110.

Inconveniently, in a critical-mode switching power supply where the on-timing of an output transistor is set by detecting a coil current having decreased to a zero value or a value close to it, if a ground short circuit (a short circuit to a grounded terminal or a comparable low-potential terminal) occurs at a current detection terminal, the coil current is erroneously detected being constantly at a zero value, and the output transistor, which has just been turned off, is immediately turned on. The output transistor then has almost no off-period, and undischarged electrical energy (electric current) continues to be accumulated in the coil. Excessive electrical energy accumulated in the coil leads to heating and destruction of the output transistor.

On the other hand, a step-up switching power supply is liable to suffer overboosting at start-up (at start-up under a light-load or no-load condition in particular).

SUMMARY OF THE INVENTION

In view of the inconveniences encountered by the present inventor, a first object of the invention disclosed herein is to provide a switching power supply that can prevent heating and destruction of an output transistor in the event of a ground short circuit at a current detection terminal.

To achieve this object, according to one aspect of what is disclosed herein, preferably, a controller IC includes: a current detection terminal for detecting a coil current passing in a switching power supply; and an on-timing setter configured to check for a ground short circuit at the current detection terminal when an output transistor turns off to generate an on-timing setting signal so as to turn on the output transistor, during normal operation, at the time point that the coil current has decreased to a zero value or a value close to it and, during a ground short circuit, after the lapse of a predetermined minimum off-period.

In view of the inconveniences encountered by the present inventor, a second object of the invention disclosed herein is to provide a switching power supply that can prevent overboosting at start-up.

To achieve this object, according to another aspect of what is disclosed herein, preferably, a controller IC that acts as a controlling agent for an output transistor included in a step-up switching power supply includes: an overboosting suppressor configured to forcibly reduce the on-duty of the output transistor during the start-up of the switching power supply.

According to yet another aspect of what is disclosed herein, preferably, a controller IC that acts as a controlling agent for an output transistor included in a step-up switching power supply includes: an error amplifier configured to generate an error voltage commensurate with the difference between the output voltage of the switching power supply or a feedback voltage commensurate with it and a predetermined reference voltage; a main comparator configured to compare the error voltage with a ramp voltage to generate a pulse width modulation signal for setting the off-timing of the output transistor; and an overboosting suppressor configured to forcibly keep, only during the start-up of the switching power supply, the gain of the error amplifier lower than during regular operation until the output voltage or the feedback voltage becomes higher than a predetermined threshold voltage lower than the reference voltage.

Other features, elements, steps, benefits, and characteristics of the present invention will become clearer with reference to the following description of preferred embodiments thereof in conjunction with the accompanying drawings.

DETAILED DESCRIPTION OF PREFERRED EMBODIMENTS

Switching Power Supply

Figure 1:
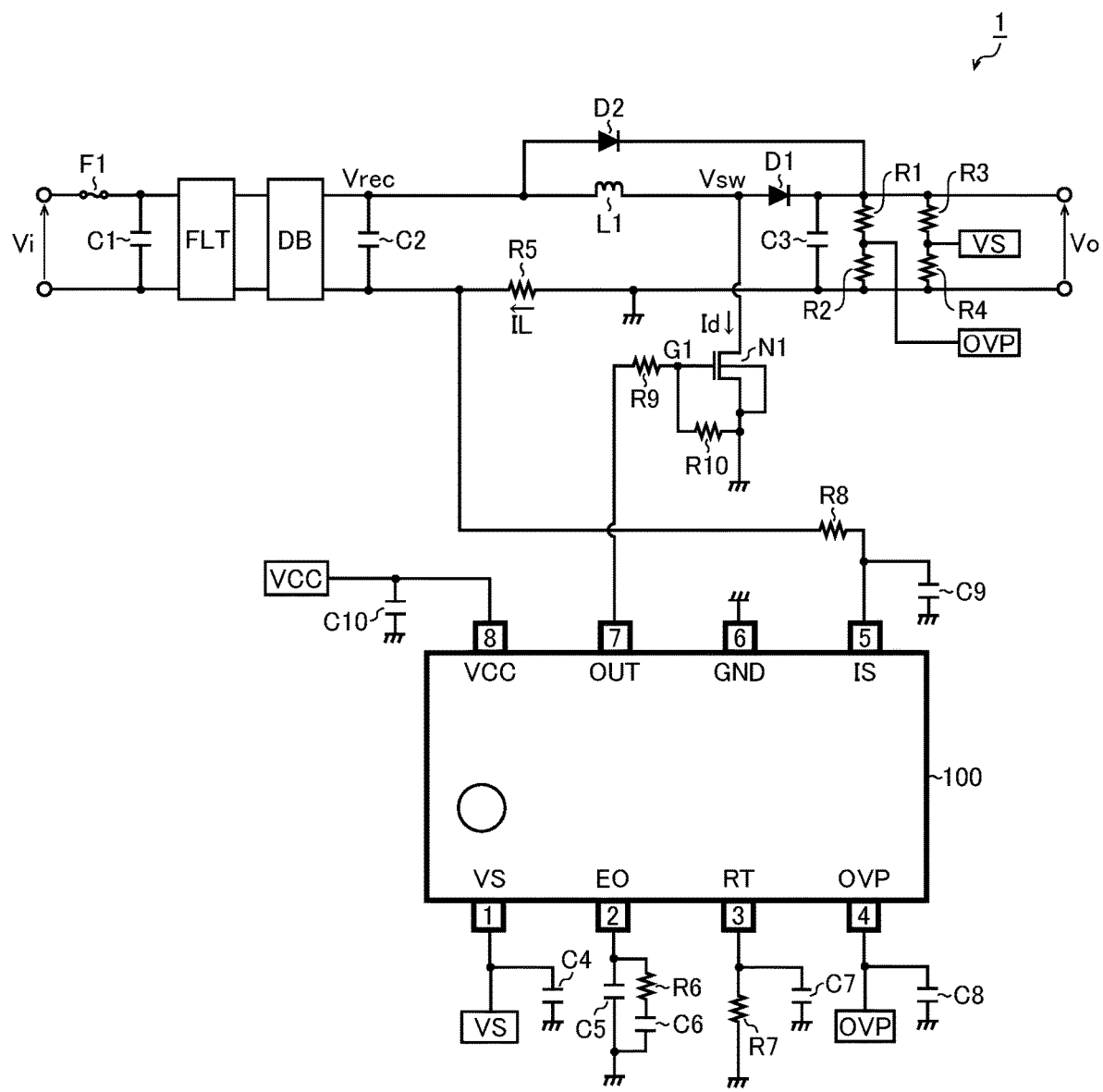
FIG. 1 is a diagram showing an overall configuration of a switching power supply.

FIG. 1 is a diagram showing an overall configuration of a switching power supply. The switching power supply 1 of this configuration example is a power conversion device (what is called an AC-DC converter) that converts an alternating-current input voltage Vi (for example, AC 85 to 265 V) to a desired direct-current output voltage Vo (for example, DC 400 V). The switching power supply 1 includes a controller IC 100 and various discrete components externally fitted to it (an output transistor N1, resistors R1 to R10, capacitors C1 to C10, diodes D1 and D2, a coil L1, a fuse F1, a filter FLT, and a diode bridge DB).

The fuse F1 is connected between a terminal to which the alternating-current input voltage Vi is applied and the input terminal of the filter FLT, and protects the switching power supply 1 by blowing out when an excessive current passes. The capacitor C1 is connected between the terminals to which the alternating-current input voltage Vi is input, and eliminates harmonic noise in the alternating-current input voltage Vi. The filter FLT eliminates noise and surges from the alternating-current input voltage Vi. The diode bridge DB generates from the filtered alternating-current input voltage Vi a full-wave rectified voltage Vrec (for example, DC 120 to 375 V). The capacitor C2 is connected between the output terminals of the diode bridge DB, and smoothes the full-wave rectified voltage Vrec.

The controller IC 100 is a semiconductor integrated circuit device that acts as the principal controlling agent in the switching power supply 1, and is provided with eight external terminals (pin 1 to pin 8) as a means for establishing electrical connection with the outside of the device. Needless to say, the controller IC 100 may be provided with any external terminals other than those just mentioned.

An output feedback terminal VS (pin 1) is connected to the connection node between the resistors R3 and R4, which are connected in series between a terminal from which the direct-current output voltage Vo is output and a grounded terminal. The resistors R3 and R4 function as a resistor voltage divider that outputs, from the connection node between them, a division voltage (=Vo×[R4/(R3+R4)]) of the direct-current output voltage Vo. Between the output feedback terminal VS and the grounded terminal, the capacitor C4, for smoothing, is connected.

A phase compensation terminal EO (pin 2) is connected to the first terminal of each of the capacitor C5 and the resistor R6. The second terminal of the resistor R6 is connected to the first terminal of the capacitor C6. The second terminal of each of the capacitors C5 and C6 is both connected to the grounded terminal. Interconnected in this way, the capacitors C5 and C6 and the resistor R6 function as a means for phase compensation for an error amplifier integrated in the controller IC 100.

An oscillation control terminal RT (pin 3) is connected to the first terminal of each of the resistor R7 and the capacitor C7. The second terminal of each of the resistor R7 and the capacitor C7 is both connected to the grounded terminal. The resistor R7 and the capacitor C7 function as a means for frequency adjustment for an oscillator integrated in the controller IC 100.

An overvoltage detection terminal OVP (pin 4) is connected to the connection node between the resistors R1 and R2, which are connected in series between the terminal from which the direct-current output voltage Vo is output and the grounded terminal. The resistors R1 and R2 function as a resistor voltage divider that outputs, from the connection node between them, a division voltage (=Vo×R2/(R1+R2)) of the direct-current output voltage Vo. Between the overvoltage detection terminal OVP and the grounded terminal, the capacitor C8, for smoothing, is connected. With the overvoltage detection terminal OVP provided separately from the output feedback terminal VS in this way, even if an open fault or a short fault occurs at either of them, the overvoltage detection function remains unaffected, resulting in enhanced safety.

A current detection terminal IS (pin 5) is an external terminal for detecting a coil current IL that passes in the switching power supply 1, and is connected via the resistor R8 to the negative-side output terminal of the diode bridge DB (that is, the first terminal of the resistor R5). The second terminal of the resistor R5 is connected to the grounded terminal. Thus, at the current detection terminal IS appears a sense voltage (=IL×R3) that is commensurate with the coil current IL, which passes from the grounded terminal via the resistor R5 to the negative-side output terminal of the diode bridge DB. Between the current detection terminal IS and the grounded terminal, the capacitor C9, for smoothing, is connected.

A ground terminal GND (pin 6) is connected to the grounded terminal.

An output terminal OUT (pin 7) is connected via the resistor R9 to the gate of the output transistor N1 (in FIG. 1, an NMOSFET (N-channel type metal-oxide-semiconductor field-effect transistor)). Between the gate and the source of the output transistor N1, the resistor R10 is connected. The source and the backgate of the output transistor N1 are connected to the grounded terminal. The first terminal of the coil L1 is connected to the positive-side output terminal of the diode bridge DB (corresponding to a terminal from which the full-wave rectified voltage Vrec is output) and to the anode of the diodes D2. The second terminal of the coil L1 is connected to the drain of the output transistor N1 and to the anode of the diode D1. The cathode of each of the diodes D1 and D2 and the first terminal of the capacitor C3 are all connected to the terminal from which the direct-current output voltage Vo is output. The second terminal of the capacitor C3 is connected to the grounded terminal.

Interconnected in this way, the output transistor N1, the coil L1, the diodes D1 and D2, and the capacitor C3 function as a step-up (boosting) switching output stage that generates the direct-current output voltage Vo from the full-wave rectified voltage Vrec. Here, the output transistor N1 is controlled to turn on and off according to a gate signal G1 fed from the output terminal OUT of the controller IC 100. More specifically, the output transistor N1 is on when the gate signal G1 is at high level, and is off when the gate signal G1 is at low level.

The stepping-up operation of the switching output stage will now be described briefly. When the output transistor N1 is turned on, a coil current IL passes in the coil L1 via the output transistor N1 toward the grounded terminal, and its electrical energy is stored in the coil L1. Meanwhile, a switching voltage Vsw that appears at the anode of the diode D1 falls, via the output transistor N1, to nearly the ground potential, and thus no current passes from the capacitor C3 into the output transistor N1.

On the other hand, when the output transistor N1 is turned off, a back electromotive force that appears in the coil L1 causes the energy stored there to be discharged as a current. Meanwhile, the diode D1 is in a reverse-biased state; thus, the coil current IL that passes via the diode D1 passes, as a direct-current output current Io, from the terminal from which the direct-current output voltage Vo is output to a load (unillustrated), and also passes via the capacitor C3 into the grounded terminal, thereby charging the capacitor C3.

The operation just described is repeated, so that, in the switching output stage, the full-wave rectified voltage Vrec is stepped up, and thereby the direct-current output voltage Vo is generated.

The switching power supply 1 of this configuration example also functions as a power factor correction circuit (PFC circuit) that brings the power factor close to one by making the envelope-line waveform of the drain current Id that passes when the output transistor N1 is on analogous to the voltage waveform of the full-wave rectified voltage Vrec (and hence the voltage waveform of the alternating-current input voltage Vi).

A power terminal VCC (pin 8) is connected to a terminal to which a supply voltage Vcc (for example, 10 to 26 V) is applied. Between the power terminal VCC and the grounded terminal, the capacitor C10, for smoothing, is connected.

Controller IC

Figure 2:
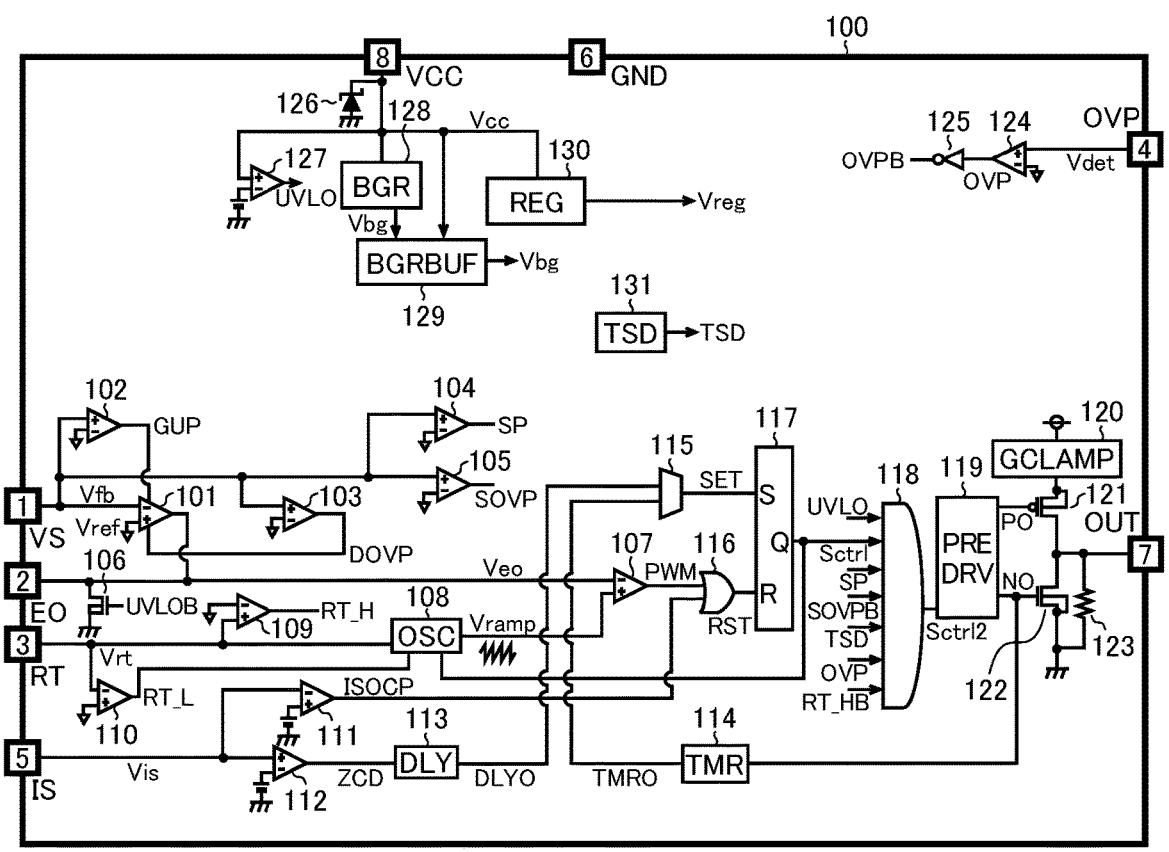
FIG. 2 is a diagram showing one configuration example of a controller IC.

FIG. 2 is a diagram showing one configuration example of the controller IC 100. The controller IC 100 of this configuration example has, integrated into it, an error amplifier 101, a GUP (gain-up) comparator 102, a DOVP (dynamic overvoltage protection) comparator 103, a SP (short protection) comparator 104, a SOVP (static OVP) comparator 105, an NMOSFET 106, a main comparator 107, an oscillator 108, a RT_H detection comparator 109, an RT_L detection comparator 110, an ISOCP (IS overcurrent protection) comparator 111, a zero-current detector 112, a signal retarder 113, a timer 114, a selector 115, an OR gate 116, an RS flip-flop 117, an AND gate 118, a pre-driver 119, a clamper 120, a PMOSFET (P-channel type MOSFET) 121, an NMOSFET 122, a resistor 123, an OVL comparator 124, an inverter 125, a Zener diode 126, an UVLO (undervoltage lock-out) comparator 127, a regulated voltage source 128, a regulated voltage buffer 129, a regulator 130, and a temperature protector 131.

The error amplifier 101 generates an error voltage Veo commensurate with the difference between a feedback voltage Vfb (the terminal voltage at the output feedback terminal VS), which is fed to the inverting input terminal (−) of the error amplifier 101, and a predetermined reference voltage Vref (for example, 2.5 V), which is fed to the non-inverting input terminal (+) of the error amplifier 101. Specifically, when the feedback voltage Vfb is higher than the reference voltage Vref, the error amplifier 101 lowers the error voltage Veo; when the feedback voltage Vfb is lower than the reference voltage Vref, the error amplifier 101 raises the error voltage Veo. The output terminal of the error amplifier 101 (that is, a terminal from which the error voltage Veo is output) is connected to the phase compensation terminal EO. The error amplifier 101 also has a function of switching a source current capability (a capability to pass a current into the phase compensation terminal EO) and a sink current capability (a capability to draw a current out of the phase compensation terminal EO) each according to both of a gain-up signal GUP and an overvoltage protection signal DOVP.

The comparator 102 generates the gain-up signal GUP by comparing the feedback voltage Vfb, which is fed to the non-inverting input terminal (+) of the comparator 102, with a GUP threshold voltage Vth102 (for example, Vref×0.9), which is fed to the inverting input terminal (−) of the comparator 102. The gain-up signal GUP is at high level (a logic level corresponding to a regular source current) when Vfb>Vth102, and is at low level (a logic level corresponding to a boosted source current) when Vfb<Vth102.

The comparator 103 generates the overvoltage protection signal DOVP by comparing the feedback voltage Vfb, which is fed to the non-inverting input terminal (+) of the comparator 103, and a DOVP threshold voltage Vth103 (for example, Vref×1.05), which is fed to the inverting input terminal (−) of the comparator 103. The overvoltage protection signal DOVP is at high level (a logic level corresponding to a boosted sink current) when Vfb>Vth103, and is at low level (a logic level corresponding to a regular sink current) when Vfb<Vth103.

The comparator 104 generates a short protection signal SP by comparing the feedback voltage Vfb, which is fed to the non-inverting input terminal (+) of the comparator 104, with an SP threshold voltage Vth104 (for example, 0.3 V), which is fed to the inverting input terminal (−) of the comparator 104. The short protection signal SP is at high level (a logic level corresponding to normal operation) when Vfb>Vth104, and is at low level (a logic level corresponding to a fault) when Vfb<Vth104.

The comparator 105 generates an overvoltage protection signal SOVP by comparing the feedback voltage Vfb, which is fed to the non-inverting input terminal (+) of the comparator 105, with a SOVP threshold voltage Vth105 (for example, Vref×1.08), which is fed to the inverting input terminal (−) of the comparator 105. The overvoltage protection signal SOVP is at high level (a logic level corresponding to a fault) when Vfb>Vth105, and is at low level (a logic level corresponding to normal operation) when Vfb<Vth105.

The NMOSFET 106 is a switching element for pulling down the error voltage Veo during UVLO operation. As for interconnection, the drain of the NMOSFET 106 is connected to the phase compensation terminal EO (that is, the output terminal of the error amplifier 101), the source and the backgate of the NMOSFET 106 are connected to the grounded terminal, and the gate of the NMOSFET 106 is connected to a terminal to which an inverted low-voltage protection signal UVLOB (a logically inverted signal of a low-voltage protection signal UVLO) is applied. Accordingly, the NMOSFET 106 is on when the inverted low-voltage protection signal UVLOB is at high level (a logic level corresponding to UVLO operation), and is off when the inverted low-voltage protection signal UVLOB is at low level (a logic level corresponding to non-UVLOB operation).

The main comparator 107 generates a pulse width modulation signal PWM by comparing the error voltage Veo, which is fed to the inverting input terminal (−) of the main comparator 107, with a ramp voltage Vramp, which is fed to the non-inverting input terminal (+) of the main comparator 107. The pulse width modulation signal PWM is at low level when the error voltage Veo is higher than the ramp voltage Vramp, and is at high level when the error voltage Veo is lower than the ramp voltage Vramp.

The oscillator 108 generates, in synchrony with a switching control signal Sctrl, the ramp voltage Vramp with a slope waveform (such as a triangular, sawtooth, or nth-order RC waveform) at a predetermined oscillation frequency fosc. The oscillation frequency fosc can be adjusted as desired according to the resistors R7 and the capacitor C7 (see FIG. 1), which are externally fitted to the oscillation control terminal RT.

The comparator 109 generates an upper limit detection signal RT_H by comparing an RT terminal voltage Vrt (the terminal voltage at the oscillation control terminal RT), which is fed to the non-inverting input terminal (+) of the comparator 109, with an upper-limit detection threshold value voltage Vth109 (for example, 1.65 V), which is fed to the inverting input terminal (−) of the comparator 109. The upper limit detection signal RT_H is at high level (a logic level corresponding to a fault) when Vrt>Vth109, and is at low level (a logic level corresponding to normal operation) when Vrt<Vth109.

The comparator 110 generates a lower limit detection signal RT_L by comparing the RT terminal voltage Vrt, which is fed to the inverting input terminal (−) of the comparator 110, with a lower-limit detection threshold value voltage Vth110 (for example, 0.15 V), which is fed to the non-inverting input terminal (+) of the comparator 110. The lower limit detection signal RT_L is at low level (a logic level corresponding to normal operation) when Vrt>Vth110, and is at low level (a logic level corresponding to a fault) when Vrt<Vth110. The lower limit detection signal RT_L is used as an enable signal EN for the oscillator 108.

The comparator 111 generates an overcurrent protection signal ISOCP by comparing a current detection voltage Vis (the terminal voltage at the current detection terminal IS), which is fed to the inverting input terminal (−) of the comparator 111, with an ISOCP threshold voltage Vth111, which is fed to the non-inverting input terminal (+) of the comparator 111. The current detection voltage Vis has a negative voltage value (<0V) when the coil current IL is passing, and has a zero value (=0V) when the coil current IL ceases to pass. Accordingly, the threshold voltage Vth111 can be set at a negative voltage value (for example, −0.6 V) that corresponds to the upper-limit value IL_H of the coil current IL. The overcurrent protection signal ISOCP is at low level (a logic level corresponding to normal operation) when Vis>Vth111, and is at high level (a logic level corresponding to a fault) when Vis<Vth111.

The zero-current detector 112 generates a zero-current detection signal ZCD by comparing the current detection voltage Vis, which is fed to the non-inverting input terminal (+) of the zero-current detector 112, with a ZCD threshold voltage Vth112, which is fed to the inverting input terminal (−) of the zero-current detector 112. As mentioned above, the current detection voltage Vis has a negative voltage value (<0V) when the coil current IL is passing, and has a zero value (=0V) when the coil current IL ceases to pass. Accordingly, the threshold voltage Vth112 can be set at a negative voltage value (for example, −10 mV) that is slightly lower than 0 V. The zero-current detection signal ZCD is at low level (a logic level corresponding to no zero current being detected) when Vis<Vth112, and is at high level (a logic level corresponding to a zero current being detected) when Vis>Vth112.

The signal retarder 113 generates a delayed zero-current detection signal DLYO (a delayed signal of the zero-current detection signal ZCD) by delaying the zero-current detection signal ZCD by a predetermined delay time Tdelay (for example, 0.6 to 2.0 μs).

The timer 114 generates a timer output signal TMRO by counting a predetermined minimum off-period Tmin_off (for example, 30 μs) after the output transistor N1 is turned off (with NO=H (high level)). As the timer 114, it is possible to divert a restart timer for counting the standby time after a termination of UVLO until a start of switching.

The selector 115 checks for a ground short circuit at the current detection terminal IS when the output transistor N1 turns off and, according to the result of the check, outputs either the zero-current detection signal ZCD (or the delayed signal of it) or the timer output signal TMRO as an on-timing setting signal SET.

The OR gate 116 performs an OR operation between the pulse width modulation signal PWM and the overcurrent protection signal ISOCP and thereby generates an off-timing setting signal RST. Accordingly, when ISOCP=L (low level) (a logic level corresponding to normal operation), RST=PWM, and when ISOCP=H (a logic level corresponding to a fault), RST=H.

The RS flip-flop 117 generates the switching control signal Sctrl according to the on-timing setting signal SET, which is fed to the set terminal (S) of the RS flip-flop 117, and the off-timing setting signal RST, which is fed to the reset terminal (R) of the RS flip-flop 117. Specifically, the RS flip-flop 117 sets the switching control signal Sctrl to high level (a logic level to turn on the output transistor N1) at the rise timing of the on-timing setting signal SET, and resets the switching control signal Sctrl to low level (a logic level to turn off the output transistor N1) at the rise timing of the off-timing setting signal RST.

The AND gate 118 performs an AND operation between the switching control signal Sctrl and the various protection signals (UVLO, SP, SOVPB (a logically inverted signal of SOVP), TSD, OVPB, RT_HB (a logically inverted signal of RT_H)), and thereby generates a switching control signal Sctrl2. Accordingly, when the various protection signals are all at high level (a logic level corresponding to normal operation), Sctrl2=Sctrl; when at least one of the various protection signals is at low level (a logic level corresponding to a fault), Sctrl2=L fixedly.

The pre-driver 119 generates gate signals PO and NO according to the switching control signal Sctrl2, which is fed to it from the AND gate 118. More specifically, the pre-driver 119 basically acts to turn on and off the PMOSFET 121 and the NMOSFET 122 complementarily, and achieves that by turning the gate signals PO and NO both to low level when the switching control signal Sctrl2 is at high level and turning the gate signals PO and NO both to high level when the switching control signal Sctrl2 is at low level.

However, to prevent an excessively high through current from passing in the PMOSFET 121 and the NMOSFET 122, these are switched between on and off states with such timing as to leave a simultaneously-off period (what is called a dead time) in which the gate signal PO is at high level and the gate signal NO is at low level.

The clamper 120 limits the supply voltage applied to the source of the PMOSFET 121 (and hence the high level of the gate signal G1) so that it is equal to or lower than a predetermined value.

The PMOSFET 121 and the NMOSFET 122 function as a half-bridge output stage for generating the gate signal G1 for the output transistor N1. The source and the backgate of the PMOSFET 121 are both connected via the clamper 120 to a supply power terminal. The drain of each of the PMOSFET 121 and the NMOSFET 122 is connected to, as a terminal from which the gate signal G1 is output, to the output terminal OUT. The source and the backgate of the NMOSFET 122 are both connected to the grounded terminal. Between the drain and the source of the NMOSFET 122, the resistor 123 is connected.

The gate of the PMOSFET 121 is fed with the gate signal PO from the pre-driver 119. Accordingly, the PMOSFET 121 is on when the gate signal PO is at high level, and is off when the gate signal PO is at low level.

The gate of the NMOSFET 122 is fed with the gate signal NO from the pre-driver 119. Accordingly, the NMOSFET 122 is on when the gate signal NO is at high level, and is off when the gate signal NO is at low level.

The comparator 124 generates an overvoltage protection signal OVP by comparing a division voltage Vdet (the terminal voltage at the overvoltage detection terminal OVP), which is fed to the non-inverting input terminal (+) of the comparator 124, with an OVP threshold voltage Vth124 (for example, Vref×1.08), which is fed to the inverting input terminal (−) of the comparator 124. The overvoltage protection signal OVP is at high level (a logic level corresponding to a fault) when Vfb>Vth124, and is at low level (a logic level corresponding to normal operation) when Vfb<Vth124. By monitoring both the feedback voltage Vfb and the division voltage Vdet with the comparators 105 and 124 in this way, it is possible to apply two-fold overvoltage protection, and thereby to give the switching power supply 1 higher safety.

The inverter 125 generates an inverted overvoltage protection signal OVPB by logically inverting the overvoltage protection signal OVP. Accordingly, the inverted overvoltage protection signal OVPB is at low level (a logic level corresponding to a fault) when the overvoltage protection signal OVP is at high level, and is at high level (a logic level corresponding to normal operation) when the overvoltage protection signal OVP is at low level.

The Zener diode 126 is an electrostatic destruction protection element at the power terminal VCC. As for interconnection, the cathode of the Zener diode 126 is connected to the power terminal VCC, and the anode of the Zener diode 126 is connected to the grounded terminal.

The comparator 127 generates the low-voltage protection signal UVLO by comparing the supply voltage Vcc (the terminal voltage at the power terminal VCC), which is fed to the non-inverting input terminal (+) of the comparator 127, with a UVLO threshold voltage Vth127 (for example, 12.0 V/9.0 V), which is fed to the inverting input terminal (−) of the comparator 127. The low-voltage protection signal UVLO is at high level (a logic level corresponding to normal operation) when Vcc>Vth127, and is at low level (a logic level corresponding to a fault) when Vcc<Vth127.

The regulated voltage source 128 generates a predetermined regulated voltage Vbg (for example, 18.0 V) from the supply voltage Vcc. Suitably used as the regulated voltage source 128 is, for example, a band-gap power supply with its low power supply dependence and low temperature dependence.

The regulated voltage buffer 129 operates by being fed with the supply voltage Vcc. The regulated voltage buffer 129 buffers and then feeds the regulated voltage Vbg fed from the regulated voltage source 128 to different blocks in the controller IC 100.

The regulator 130 generates a predetermined internal supply voltage Vreg (for example, 4.0 V) from the supply voltage Vcc.

The temperature protector 131 generates a temperature protection signal TSD by comparing the junction temperature Tj of the controller IC 100 and a TSD threshold temperature Tth (for example, 150° C./175° C.). The temperature protection signal TSD is at low level (a logic level corresponding to a fault) when Tj>Tth, and is at high level (a logic level corresponding to normal operation) when Tj<Tth.

On-Timing Setter

Of the components shown in FIG. 2, the zero-current detector 112, the signal retarder 113, the timer 114, and the selector 115 function as an on-timing setter 200 that, when the output transistor N1 turns off, checks for a ground short circuit at the current detection terminal IS (pin 5) to generate the on-timing setting signal SET such that, during normal operation, the output transistor N1 is turned on at the time point that the coil current IL has decreased to a zero value or a value close to it and, during a ground short circuit, the output transistor N1 is turned on at the lapse of a predetermined minimum off-period Toff_min. The configuration and operation of the on-timing setter 200 will now be described in detail.

Figure 3:
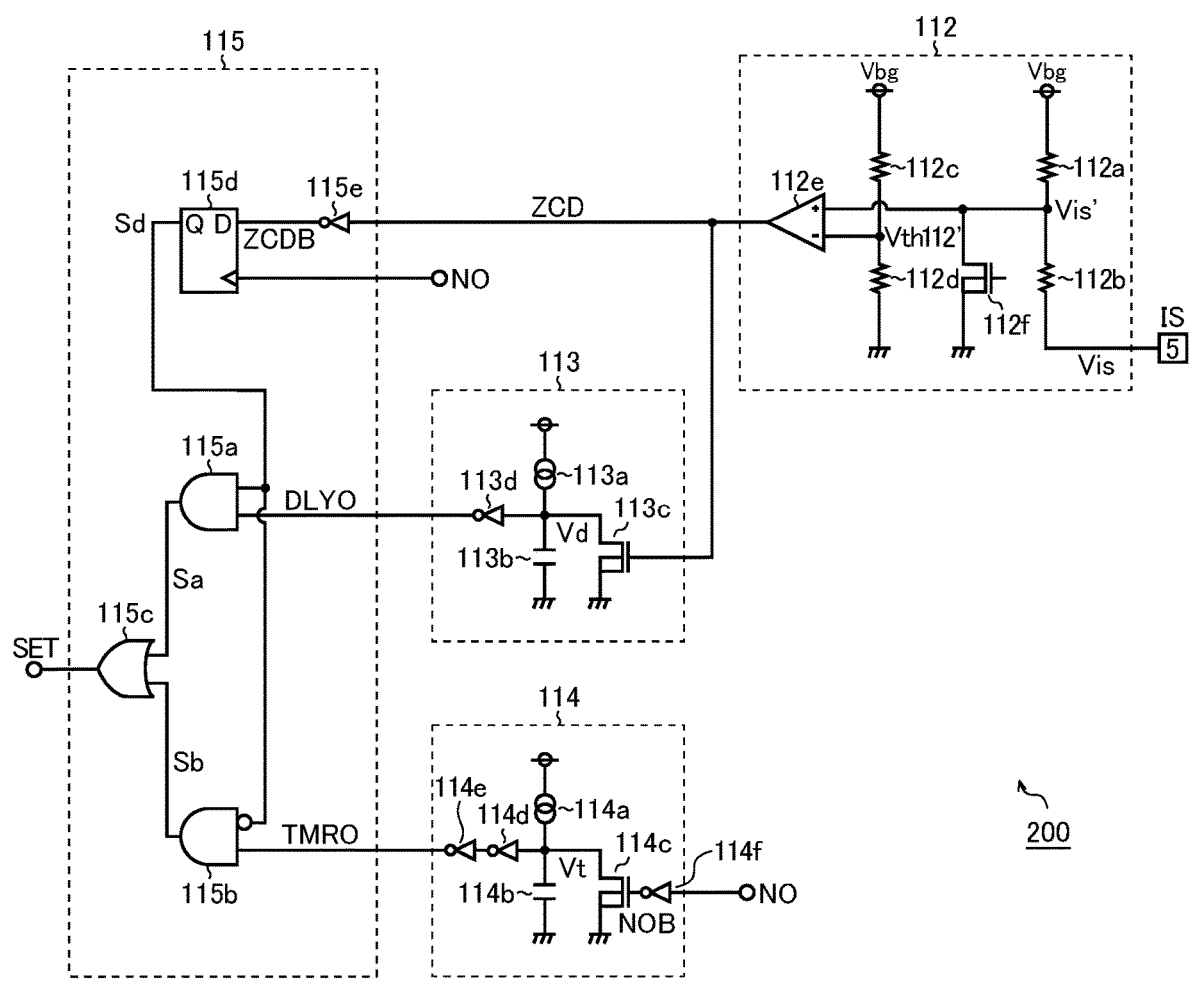
FIG. 3 is a diagram showing one configuration example of an on-timing setter.

FIG. 3 is a diagram showing one configuration example of the on-timing setter 200. The on-timing setter 200 of this configuration example includes, as mentioned above, the zero-current detector 112, the signal retarder 113, the timer 114, and the selector 115.

The zero-current detector 112 includes resistors 112a to 112d, a comparator 112e, and an NMOSFET 112f.

The resistors 112a and 112b are connected in series between a terminal to which the regulated voltage Vbg is applied and the current detection terminal IS (that is, a terminal to which the current detection voltage Vis is applied). The resistors 112a and 112b function as a first resistor voltage divider that shifts the current detection voltage Vis toward the regulated voltage Vbg and thereby generates a division terminal voltage Vis'(=(Rb×Vbg+Ra×Vis)/(Ra+Rb)).

The resistors 112c and 112d are connected in series between the terminal to which the regulated voltage Vbg is applied and the grounded terminal. The resistors 112c and 112d function as a second resistor voltage divider that divides the regulated voltage Vbg and thereby generates a threshold voltage Vth112' (=Vbg×[Rd/(Rc+Rd)]). The threshold voltage Vth112' corresponds to a voltage resulting from the level of the threshold voltage Vth112 (for example, −10 mV) being shifted to the positive side by the same amount as the level shift from the current detection voltage Vis to the division terminal voltage Vis'.

The comparator 112e generates the zero-current detection signal ZCD by comparing the division terminal voltage Vis', which is fed to the non-inverting input terminal (+) of the comparator 112e, with the threshold voltage Vth112', which is fed to the inverting input terminal (−) of the comparator 112e. The zero-current detection signal ZCD is at low level (a logic level corresponding to no zero current being detected) when Vis'<Vth112', and is at high level (a logic level corresponding to a zero current being detected) when Vis'>Vth112'.

The NMOSFET 112f is a switching element for pulling down the division terminal voltage Vis' when the zero-current detector 112 is in a disabled state. As for interconnection, the drain of the NMOSFET 112f is connected to a terminal to which the division terminal voltage Vis' is applied (that is, the non-inverting input terminal (+) of the comparator 112e); the source and the backgate of the NMOSFET 112f are connected to the grounded terminal. The NMOSFET 112f is on when the zero-current detector 112 is in a disabled state, and is off when the zero-current detector 112 is in an enabled state.

In a stage preceding the zero-current detector 112, a filter for eliminating noise in the current detection voltage Vis may be provided.

The signal retarder 113 includes a current source 113a, a capacitor 113b, an NMOSFET 113c, and an inverter 113d.

The current source 113a is connected between the supply power terminal and the first terminal of the capacitor 113b, and generates a charge current for the capacitor 113b. The second terminal of the capacitor 113b is connected to the grounded terminal.

The capacitor 113*b* is charged with the charge current fed from the current source 113*a*, and the voltage across the capacitor 113*b* is fed, as the charge voltage Vd, to the inverter 113*d*.

The NMOSFET 113*c* is connected in parallel with the capacitor 113*b*, and functions as a discharge switch that discharges the capacitor 113*b* according to the zero-current detection signal ZCD. The NMOSFET 113*c* is on when ZCD=H, and is off when ZVD=L.

The inverter 113*d* (with a logical inversion level Vth113*d*) generates the delayed zero-current detection signal DLYO from the charge voltage Vd across the capacitor 113*b*. When Vd>Vth113*d*, DLYO=L, and when Vd<Vth113, DLYO=H.

Thus, with the signal retarder 113 in this configuration example, a rise in the delayed zero-current detection signal DLYO can be delayed by a very short time (corresponding to the delay time Tdelay) that is required, after the zero-current detection signal ZCD rises to high level and the capacitor 113*b* starts to be discharged, for the charge voltage Vd to fall below the logical inversion level of the inverter 113*d*. The delay time Tdelay can be set freely through the adjustment of the charge current value and the capacitance value of the capacitor 113*b*.

The timer 114 includes a current source 114*a*, a capacitor 114*b*, an NMOSFET 114*c*, and inverters 114*d* to 114*f*.

The current source 114*a* is connected between the supply power terminal and the first terminal of the capacitor 114*b*, and generates a charge current for the capacitor 114*b*. The second terminal of the capacitor 114*b* is connected to the grounded terminal.

The capacitor 114*b* is charged with the charge current fed from the current source 114*a*, and the voltage across the capacitor 114*b* is fed, as the charge voltage Vt, to the inverter 114*d*.

The NMOSFET 114*c* is connected to in parallel with the capacitor 114*b*, and functions as a discharge switch that discharges the capacitor 114*b* according to an inverted gate signal NOB (a logically inverted signal of the gate signal NO). The NMOSFET 114*c* is on when NOB=H, and is off when NOB=L. Thus, the on-period of the output transistor N1 corresponds to the discharge period of the capacitor 114*b* (that is, the reset period of the timer 114), and the off-period of the output transistor N1 corresponds to the discharge stop period of the capacitor 114*b* (that is, the count period of the timer 114).

The inverters 114*d* and 114*e* are connected in series between the first terminal of the capacitor 114*b* and a terminal from which the timer output signal TMRO is output. The inverters 114*d* and 114*e* function as a buffer (with a logical inversion level BUFth) that generates the timer output signal TMRO from the charge voltage Vt across the capacitor 114*b*. When Vt>BUFth, TMRO=H, and when Vt<BUFth, TMRO=L.

The inverter 114*f* logically inverts the gate signal NO to generate the inverted gate signal NOB. Accordingly, when NO=H, NOB=L, and when NO=L, NOB=H.

Thus, with the timer 114 in this configuration example, the timer output signal TMRO is raised to high level when, after the output transistor N1 is turned off (NO=H) and the capacitor 114*b* stops being discharged, the charge voltage Vd has increased to be higher than the logical inversion level BUFth of the buffer (that is, the inverters 114*d* and 114*e*). The time required after the output transistor N1 is turned off until the timer output signal TMRO rises to high level corresponds to a minimum off-period Toff_min. Like the delay time Tdelay mentioned above, the minimum off-period Toff_min can be set freely through the adjustment of the charge current value and capacitance value of the capacitor 114*b*.

The selector 115 includes AND gates 115*a* and 115*b*, an OR gate 115*c*, a D flip-flop 115*d*, and an inverter 115*e*.

The AND gate 115*a* generates an AND signal Sa between the delayed zero-current detection signal DLYO and a ground short circuit detection signal Sd. Accordingly, when the ground short circuit detection signal Sd is at high level (a logic level corresponding to normal operation), Sa=DLYO, and when the ground short circuit detection signal Sd is at low level (a logic level corresponding to a fault), Sa=L fixedly.

The AND gate 115*b* generates an AND signal Sb between the delayed zero-current detection signal DLYO and a logically inverted signal of the ground short circuit detection signal Sd. Accordingly, when the ground short circuit detection signal Sd is at low level (a logic level corresponding to a fault), Sb=TMRO, and when the ground short circuit detection signal Sd is at high level (a logic level corresponding to normal operation), Sb=L fixedly.

The OR gate 115*c* generates an OR signal of the AND signals Sa and Sb, and outputs it as the on-timing setting signal SET. Accordingly, the on-timing setting signal SET is at low level when the AND signals Sa and Sb are both at low level, and is at high level when at least one of the AND signals Sa and Sb is at high level.

The D flip-flop 115*d* latches an inverted zero-current detection signal ZCDB (a logically inverted signal of the zero-current detection signal ZCD), which is fed to the data input terminal (D) of the D flip-flop 115*d*, at the rise timing of a gate signal GO, which is fed to the clock input terminal of the D flip-flop 115*d* (that is, at the off-timing of the output transistor N1), and outputs the latched signal, from the output terminal (Q) of the D flip-flop 115*d*, as the ground short circuit detection signal Sd.

The inverter 115*e* logically inverts the zero-current detection signal ZCD and thereby generates the inverted zero-current detection signal ZCDB. Accordingly, when ZCD=H, ZCDB=L, and when ZCD=L, ZCDB=H.

As described above, the selector 115 selects either the delayed zero-current detection signal DLYO or the timer output signal TMRO according to the latched output signal of the D flip-flop 115*d* (that is, the ground short circuit detection signal Sd), and outputs the selected signal as the on-timing setting signal SET.

More specifically, when the ground short circuit detection signal Sd is at high level (a logic level corresponding to normal operation), the AND gate 115*a* is in a signal-passing state and the AND gate 115*b* is in a signal-cutoff state. Accordingly, the delayed zero-current detection signal DLYO is output as the on-timing setting signal SET, and thus the output transistor N1 is controlled, as usual, in a critical mode.

On the other hand, when the ground short circuit detection signal Sd is at low level (a logic level corresponding to a fault), the AND gate 115*a* is in a signal-cutoff state, and the AND gate 115*b* is in a signal-passing state. Accordingly, the timer output signal TMRO is output as the on-timing setting signal SET, and this makes the set minimum off-period Toff_min valid.

As described above, of the above-mentioned components of the on-timing setter 200, the timer 114 and the selector 115 in particular are newly introduced as a means for setting the minimum off-period Toff_min in the event of a ground short circuit at the current detection terminal IS (for example, in the event of a short circuit between the current detection terminal IS and the ground terminal GND, which are located next to each other). To follow is a description of operation for setting the minimum off-period Toff_min and the technical significance of such operation.

Minimum Off-Period Setting Operation

Figure 4:
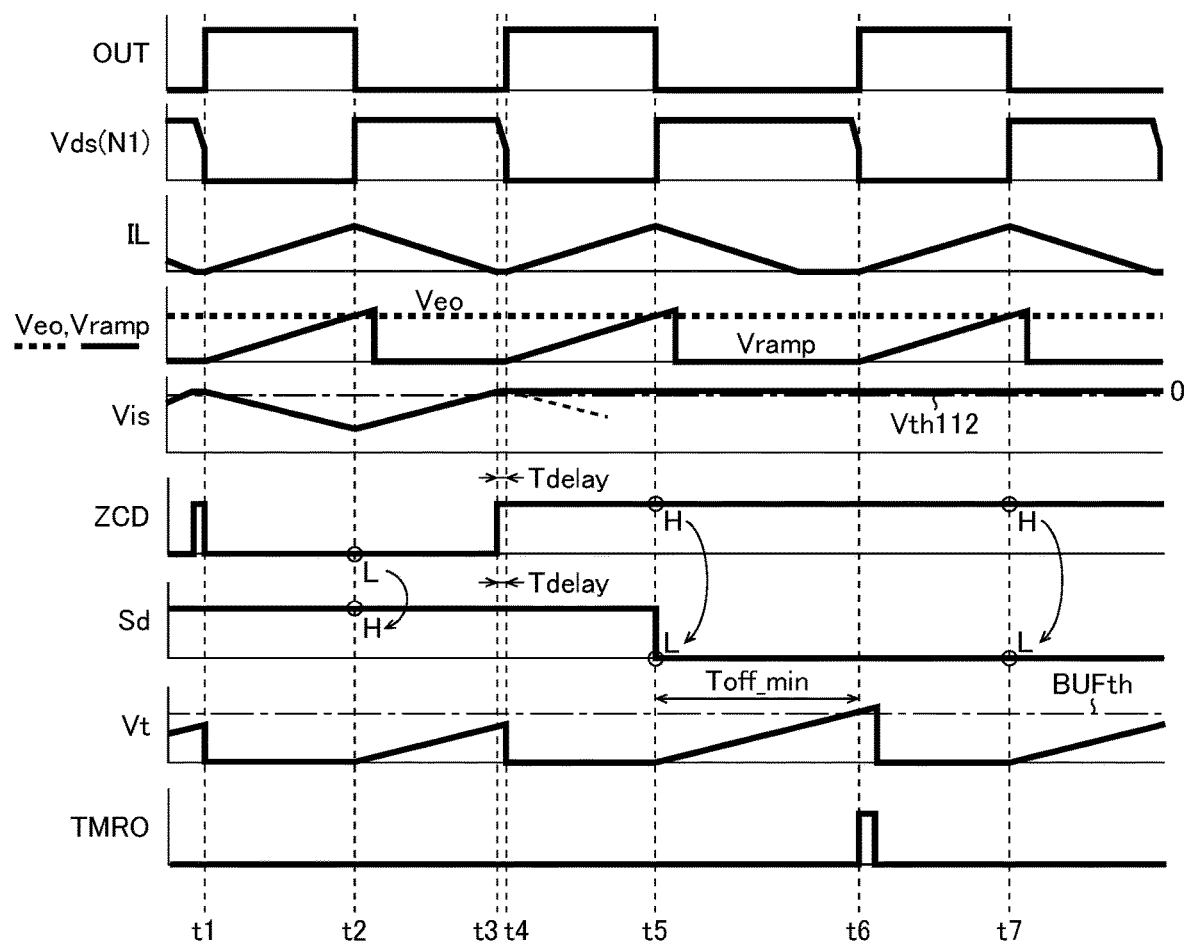
FIG. 4 is a timing chart showing minimum off-period setting operation during an IS-GND short circuit.

FIG. 4 is a timing chart showing minimum off-period setting operation during a IS-GND short circuit, depicting, from top down, the terminal voltage at the output terminal OUT (corresponding to the gate signal G1 for the output transistor N1), the drain-source voltage Vds(N1) of the output transistor N1, the coil current IL, the error voltage Veo (broken lime) and the ramp voltage Vramp (solid line), the current detection voltage Vis, the zero-current detection signal ZCD, the ground short circuit detection signal Sd, the charge voltage Vt across the capacitor 114b (corresponding to the count value of the timer 114), and the timer output signal TMRO.

Between time points t1 and t2 is the high-level period of the output terminal OUT (that is, the on-period of the output transistor N1), and the length of the period varies with the load. More specifically, the heavier the load, the higher the error voltage Veo and thus the later the timing at which it crosses the ramp voltage Vramp (that is, the off-timing of the output transistor N1). Accordingly, the high-level period of the output terminal OUT is then longer. Reversely, the lighter the load, the lower the error voltage Veo and thus the earlier the timing at which it crosses the ramp voltage Vramp. Accordingly, the high-level period of the output terminal OUT is then shorter.

During the high-level period of the output terminal OUT, as the coil current IL increases, the current detection voltage Vis decreases from 0 V to the negative voltage side. Moreover, during the high-level period of the output terminal OUT, the capacitor 114b is discharged, so that Vt=0 V.

At time point t2, when the error voltage Veo becomes higher than the ramp voltage Vramp, the output transistor N1 is turned off. As a result, the coil current IL, which has thus far been increasing, starts decreasing, and thus the current detection voltage Vis starts to increase toward 0 V. It should be noted that, at the off-timing of the output transistor N1 (that is, at time point t2), unless an IS-GND short circuit is occurring, Vis<Vth112 (for example, −10 mV); thus ZCD=L, and thus the ground short circuit detection signal Sd is at high level (a logic level corresponding to normal operation). Thus, the next on-timing of the output transistor N1 is determined based on the zero-current detection signal ZCD.

Moreover, when the output transistor N1 is turned off, the ramp voltage Vramp is reset to a zero value. Also, when the output transistor N1 is turned off, the capacitor 114b stops being discharged, and thus the charge voltage Vt starts to increase with a predetermined gradient.

Thereafter, the coil current IL keeps decreasing, and when, at time point t3, Vis>Vth112 is fulfilled, then ZCD=H. Accordingly, at the lapse of the delay time Tdelay after that time point, that is, at time point t4, the output transistor N1 is turned back on. It should be noted that, as the output transistor N1 turns on, the capacitor 114b is discharged; thus the charge voltage Vt is reset to 0 V before it exceeds the logical inversion level BUFth of the buffer (that is, the inverters 114d and 114e). Thus, the timer output signal TMRO is restrained from rising to high level.

After time point t4, unless an IS-GND short circuit occurs, the above-described switching control in a critical mode is supposed to continue. However, in FIG. 4, an IS-GND short circuit occurs after time point t3, with the result that the current detection voltage Vis stays pegged at 0 V (>Vth112). In this situation, at the time point that the error voltage Veo becomes higher than the ramp voltage Vramp and the output transistor N1 is turned off (that is, at time point t5), Vis>Vth112 is already fulfilled.

Thus, if, for discussion's sake, no function of setting the minimum off-period Toff_min of the output transistor N1 is introduced, the output transistor N1, which has just been turned off at time point t5, is turned on immediately. This causes excessive electrical energy to be stored in the coil L1, and leads to heating and destruction of the output transistor N1.

To overcome the inconvenience, the controller IC 100 of this configuration example has introduced into it a function of checking for a ground short circuit at the current detection terminal IS when the output transistor N1 turns off to allow, in the event of a ground short circuit, setting of the minimum off-period Toff_min of the output transistor N1.

More specifically, when an IS-GND short circuit is occurring, at the off-timing of the output transistor N1 (that is, at time point t5), Vis>Vth112, and thus VCD=H; thus the ground short circuit detection signal Sd is at low level (a logic level corresponding to a fault). Accordingly, the on-timing of the output transistor N1 after time point t5 is determined not based on the zero-current detection signal ZCD but based on timer output signal TMRO.

In terms of what is shown in FIG. 4, when the output transistor N1 turns off (NO=H) at time point t5, the capacitor 114b stops being discharged, and thus the charge voltage Vt starts to increase with a predetermined gradient. Only when, at time point t6, the charge voltage Vt has increased to be higher than the logical inversion level BUFth of the buffer (that is, the inverters 114d and 114e) is the timer output signal TMRO raised to high level and the output transistor N1 turned on.

Likewise, after time point t6, unless the IS-GND short circuit is resolved, the on-timing of the output transistor N1 continues to be set according to the timer output signal TMRO. On the other hand, the off-timing of the output transistor N1 is, as before, set according to the result of comparison of the error voltage Veo with the ramp voltage Vramp (see time point t7).

As described above, when an IS-GND short circuit occurs, the minimum off-period Toff_min of the output transistor N1 is forcibly secured by use of the timer 114. Accordingly, during this minimum off-period Toff_min, the electrical energy (current) in the coil L1 can be discharged, and thereby, eventually, the output transistor N1 can be prevented from heating and destruction.

Operating State Transition

Figure 5:
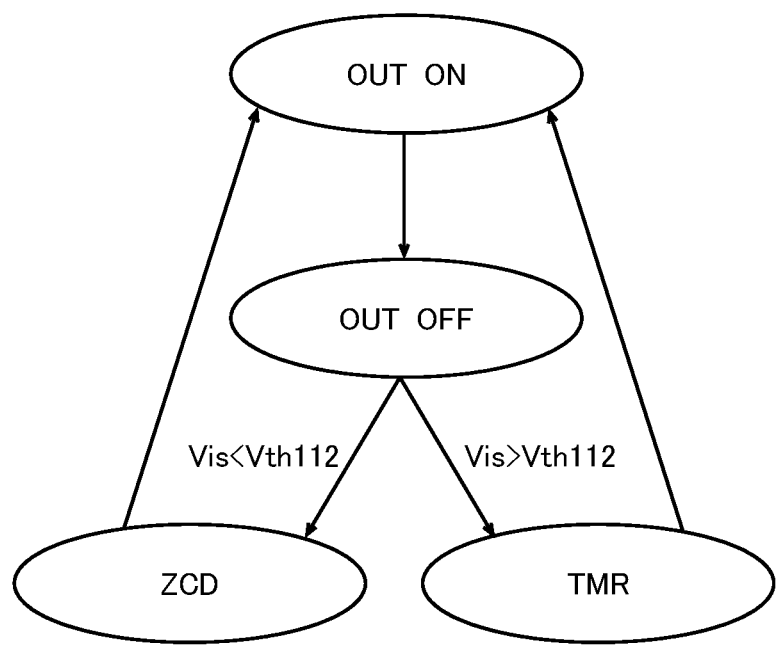
FIG. 5 is a state machine diagram showing operating state transition of a switching power supply.

FIG. 5 is a state machine diagram showing transition among different operating states of the switching power supply 1 described above. In the diagram, "OUT ON" represents the high-level period of the output terminal OUT (that is, the on-period of the output transistor), and "OUT OFF" represents the low-level period of the output terminal OUT (that is, the off-period of the output transistor N1). Moreover, in the diagram, "ZCD" represents on-timing setting operation according to the zero-current detection signal ZCD, and "TMR" represents on-timing setting operation according to the timer output signal TMRO.

As described previously, at the off-timing of the output transistor N1, if Vis<Vth112, then, on the assumption that an IS-GND short circuit is occurring, on-timing setting operation based on the zero-current detection signal ZCD is performed so that the output transistor N1 shifts to the on-period.

On the other hand, at the off-timing of the output transistor N1, if Vis>Vth112, then, on the assumption that an IS-GND short circuit is occurring, on-timing setting operation based on the timer output signal TMRO is performed so that the output transistor N1 shifts to the on-period.

Effect of Introduction of a Minimum Off-Period Setting Function

Figure 6:
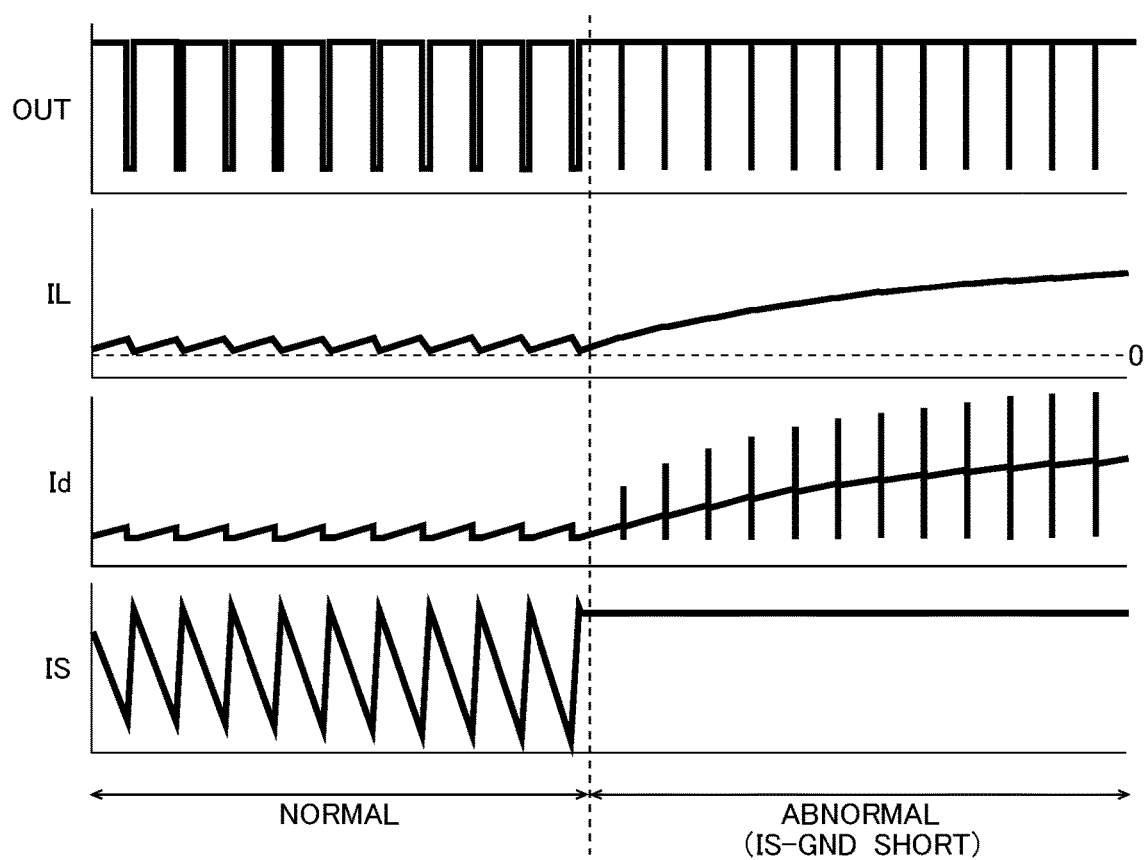
FIG. 6 is a diagram showing behavior observed during an IS-GND short circuit (with no minimum off-period setting function introduced)

FIG. 6 is a diagram showing behavior observed in the event of an IS-GND short circuit in a case where no function of setting the minimum off-period Toff_min is introduced, depicting, from top down, the terminal voltage at the output terminal OUT (corresponding to the gate signal G1 of the output transistor N1), the coil current IL, the drain current Id, and the terminal voltage at the current detection terminal IS (corresponding to the current detection voltage Vis). In this diagram, on the left of the vertical broken line is shown a normal-operation state, and on the right of the vertical broken line is shown a faulty state (that is, an IS-GND short circuit state).

As shown on the right of the vertical broken line in the diagram, in a case where no function of setting the minimum off-period Toff_min is introduced, when an IS-GND short circuit (IS=0V) occurs, the coil current IL is erroneously detected being constantly at a zero value, and thus the output transistor N1, which has just been turned off, is immediately turned on. The output transistor N1 then has almost no off-period, and thus the coil current IL and the drain current Id keeps increasing. If undischarged electrical energy (current) continues to be accumulated in the coil L1, the stress on the output transistor N1 increases, leading to heating and destruction of the output transistor N1.

Figure 7:
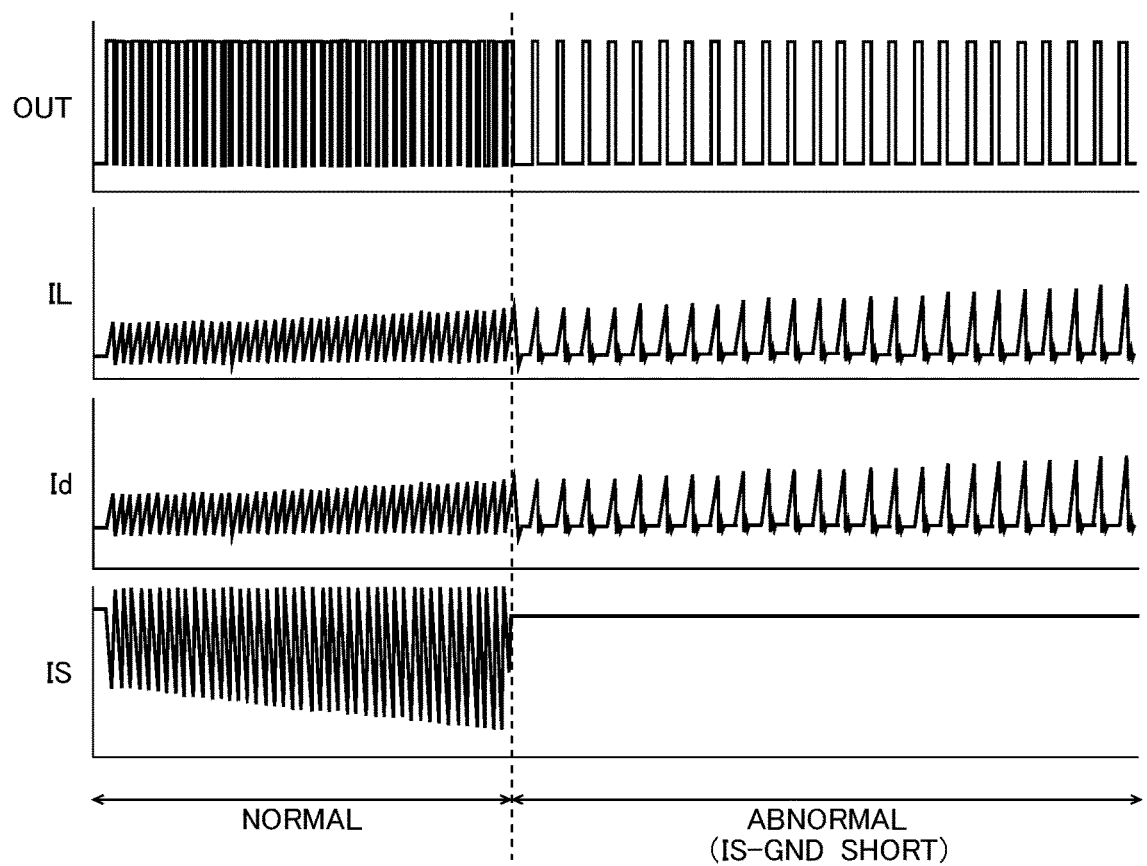
FIG. 7 is a diagram showing behavior observed during an IS-GND short circuit (with a minimum off-period setting function introduced)

FIG. 7 is a diagram showing behavior observed in the event of an IS-GND short circuit in a case where a function of setting the minimum off-period Toff_min is introduced, depicting, as does FIG. 6 referred to previously, from top down, the terminal voltage at the output terminal OUT (corresponding to the gate signal G1 of the output transistor N1), the coil current IL, the drain current Id, and the terminal voltage at the current detection terminal IS (corresponding to the current detection voltage Vis). In this diagram, on the left of the vertical broken line is shown a normal-operation state, and on the right of the vertical broken line is shown a faulty state (that is, an IS-GND short circuit state).

As shown on the right of the vertical broken line in the diagram, in a case where a function of setting the minimum off-period Toff_min is introduced, even when an IS-GND short circuit (IS=0V) occurs, the off-period of the output transistor N1 is secured. Accordingly, unlike in FIG. 6 referred to previously, the electrical energy that has been stored in the coil L1 can be discharged properly; thus, the coil current IL and the drain current Id are restrained from keeping increasing, and this reduces the stress on the output transistor N1.

A function of setting the minimum off-period Toff_min in the event of a ground short circuit at the current detection terminal IS can be introduced not only in a PFC circuit like the one taken as an example in the embodiment described above but widely in critical-mode switching power supplies (and controller ICs used in them) in general. Also, the switching output stage of a switching power supply can be of any of various output types (such as a positive step-up type, a negative step-up type, a step-down (bucking) type, a step-up/down type, and an inverting type), and can be of any of different insulation types (an insulating or non-insulating type).

Error Amplifier (First Embodiment)

The error amplifier 101 in FIG. 2 is furnished with an overboosting suppressor for suppressing overboosting at the start-up of the switching power supply 1 (in particular, at its start-up under a light-load or no-load condition). The configuration and operation of the error amplifier 101 will now be described.

Figure 8:
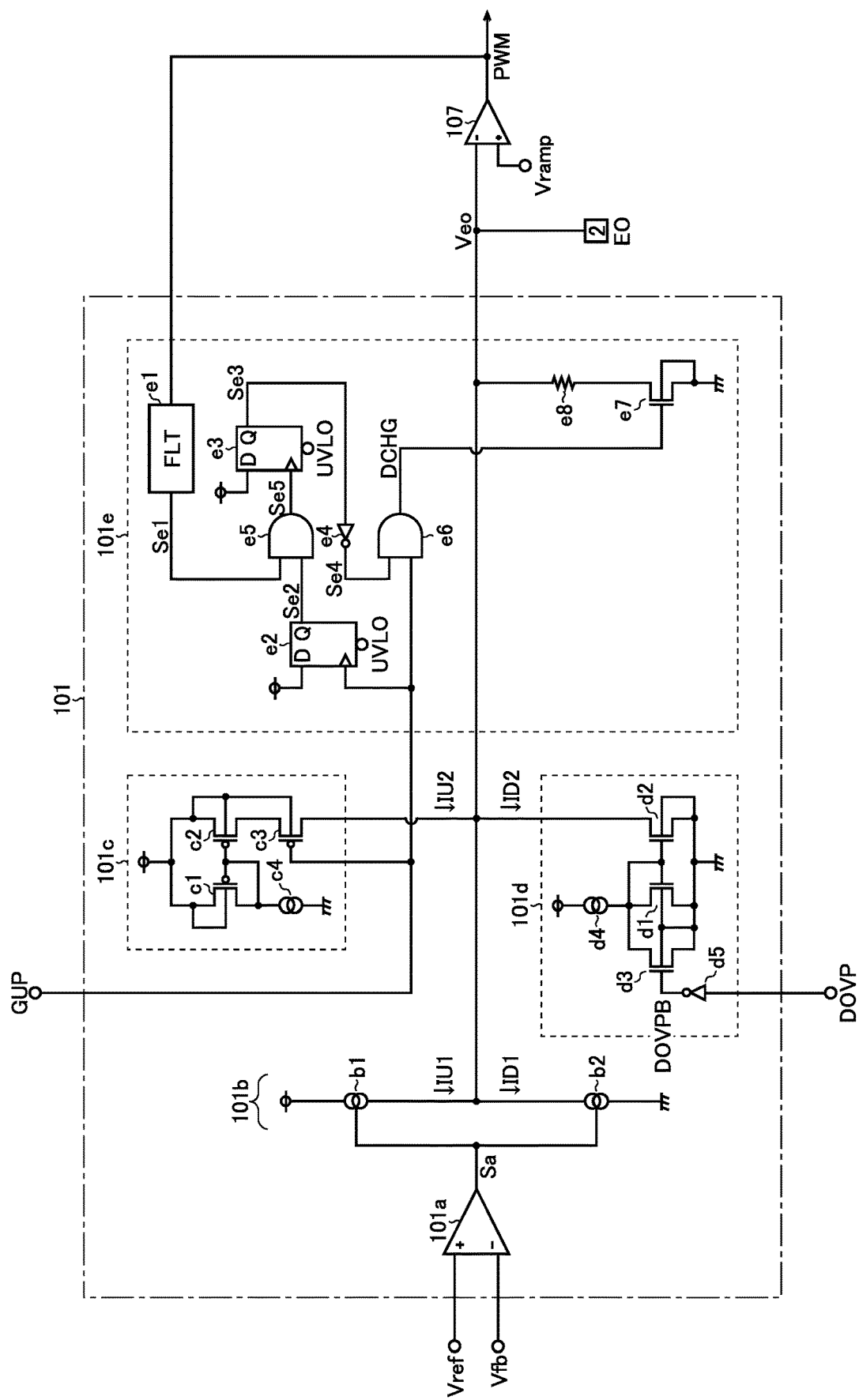
FIG. 8 is a diagram showing a first embodiment of an error amplifier.

FIG. 8 is a diagram showing a first embodiment of the error amplifier 101. The error amplifier 101 of this embodiment includes a differential input stage 101a, a current output stage 101b, an auxiliary source current generator 101c, an auxiliary sink current generator 101d, and an overboosting suppressor 101e.

The differential input stage 101a generates a current control signal Sa commensurate with the difference (=|Vfb−Vref|) between the feedback voltage Vfb, which is fed to the inverting input terminal (−) of the differential input stage 101a, and the reference voltage Vref, which is fed to the non-inverting input terminal (+) of the differential input stage 101a. The current control signal Sa is a voltage signal that can take either a positive or negative value relative to, as a reference value (that is, a zero value), the output bias point of the differential input stage 101a. More specifically, when Vfb<Vref, the larger the difference between the two signals, the higher the current control signal Sa in the positive direction. Reversely, when Vfb>Vref, the larger the difference between the two signals, the higher the current control signal Sa in the negative direction. In a case where the direct-current output voltage Vo is within the input dynamic range of the differential input stage 101a, instead of the feedback voltage Vfb (a division voltage of the direct-current output voltage Vo), the direct-current output voltage Vo may be fed directly to the differential input stage 101a.

The current output stage 101b includes current sources b1 and b2. According to the current control signal Sa fed from the differential input stage 101a, the current output stage 101b generates a source current IU1 (for example, 30 µA at its maximum) and a sink current ID1 (for example, 30 µA at its maximum). The current source b1 is connected between the supply power terminal and the phase compensation terminal EO (that is, the terminal from which the error voltage Veo is output); according to the current control signal Sa when it has a positive value, the current source b1 generates the source current IU1. Accordingly, when Vfb<Vref, the source current IU1 is passed from the supply power terminal into the phase compensation terminal EO, and thus the error voltage Veo increases. On the other hand, the current source b2 is connected between the phase compensation terminal EO and the grounded terminal; according to the current control signal Sa when it has a negative value, the current source b2 generates the sink current ID1. Accordingly, when Vfb>Vref, the sink current ID1 is drawn out of the phase compensation terminal EO toward the grounded terminal, and thus the error voltage Veo decreases.

The auxiliary source current generator 101c includes PMOSFETs c1 to c3 and a current source c4. According to the gain-up signal GUP, the auxiliary source current generator 101c generates an auxiliary source current IU2 (for example, 20 µA). The circuit configuration here is as follows. The source and the backgate of each of the PMOSFETs c1 and c2 are all connected to the supply power terminal. The gate of each of the PMOSFETs c1 and c2 is connected to the drain of the PMOSFET c1. Between the drain of the PMOSFET c1 and the grounded terminal, the current source c4 is connected. The drain of the PMOSFET c2 is connected to the source of the PMOSFET c3. The drain of the PMOSFET c3 is connected to the phase compensation terminal EO (that is, the output terminal of the current output stage 101b). The gate of the PMOSFET c3 is connected to a terminal to which the gain-up signal GUP is fed. The backgate of the PMOSFET c3 is connected to the supply power terminal.

In the auxiliary source current generator 101c in this configuration example, the PMOSFETs c1 and c2 function as a current mirror that mirrors the drain current of the PMOSFET c1 (that is, the constant current generated by the current source c4) to produce the drain current of the PMOSFET c2. The PMOSFET c3 functions as a switching element that switches between a conducting state and a cut-off state the path between the drain of the PMOSFET c2 and the phase compensation terminal EO.

It should be noted that, when GUP=L (that is, Vfb<Vth102), the PMOSFET c3 is on, and thus the path between the drain of the PMOSFET c2 and the phase compensation terminal EO is in a conducting state. As a result, separately from the source current IU1 in the current output stage 101b, the auxiliary source current IU2 is passed into the phase compensation terminal EO, and this makes it easier for the error voltage Veo to increase.

On the other hand, when GUP=H (that is, Vfb>Vth102), the PMOSFET c3 is off, and thus the path between the drain of the PMOSFET c2 and the phase compensation terminal EO is in a cut-off state. As a result, no auxiliary source current IU2 is passed into the phase compensation terminal EO.

As described above, in the auxiliary source current generator 101c, while the feedback voltage Vfb stays lower than the threshold voltage Vth102 (corresponding to a first threshold voltage) which is lower than the reference voltage Vref, the auxiliary source current IU2 is generated, and this boosts the current source capability of the error amplifier 101. Accordingly, in the event of a drop in the direct-current output voltage Vo resulting from an increase in the load, it is possible to promptly raise the error voltage Veo and thereby increase the on-duty Don (=Ton/T, where Ton represents the on-period of the output transistor N1 and T represents the switching period) of the output transistor N1. It is thus possible to minimize transitional variation of the direct-current output voltage Vo.

The auxiliary sink current generator 101d includes NMOSFETs d1 to d3, a current source d4, and an inverter d5. According to the overvoltage protection signal DOVP, the auxiliary sink current generator 101d generates an auxiliary sink current ID2 (for example, 20 μA). The circuit configuration here is as follows. The source and the backgate of each of the NMOSFETs d1 to d3 are all connected to the grounded terminal. The gate of each of the NMOSFETs d1 and d2 and the drain of the NMOSFET d3 are all connected to the drain of the NMOSFET d1. Between the drain of the NMOSFET d1 and the supply power terminal, the current source d4 is connected. The drain of the NMOSFET d2 is connected to the phase compensation terminal EO (that is, the output terminal of the current output stage 101b). The gate of the NMOSFET d3 is connected to the output terminal of the inverter d5 (that is, a terminal from which an inverted overvoltage protection signal DOVPB is output). The input terminal of the inverter d5 is connected to a terminal to which the overvoltage protection signal DOVP is fed.

In the auxiliary sink current generator 101d in this configuration example, the NMOSFETs d1 and d2 function as a current mirror that mirrors the drain current of the NMOSFET d1 (that is, the constant current generated by the current source d4) to produce the drain current of the NMOSFET d2. The NMOSFET d3 functions as a switching element that switches the current mirror between an enabled state and a disabled state by switching the drain-source channel of the NMOSFET d1 between a conducting state and a cut-off state.

When DOVPB=H (that is, Vfb<Vth103), the NMOSFET d3 is off; accordingly, the drain-source channel of the NMOSFET d1 is in a cut-off state, and thus the current mirror is in an enabled state. As a result, separately from the sink current ID1 in the current output stage 101b, the auxiliary sink current ID2 is drawn out of the phase compensation terminal EO, and this makes it easier for the error voltage Veo to decrease.

On the other hand, when DOVPB=H (that is, Vfb<Vth103), the NMOSFET d3 is on; accordingly, the drain-source channel of the NMOSFET d1 is in a conducting state, and thus the current mirror is in a disabled state. As a result, no auxiliary sink current ID2 is drawn out of the phase compensation terminal EO.

As described above, in the auxiliary sink current generator 101d, while the feedback voltage Vfb stays higher than the threshold voltage Vth103 (corresponding to a second threshold voltage) which is higher than the reference voltage Vref, the auxiliary sink current ID2 is generated, and this boosts the current sink capability of the error amplifier 101. Accordingly, when the direct-current output voltage Vo shows signs of an overvoltage fault, it is possible to promptly lower the error voltage Veo and thereby reduce the on-duty Don of the output transistor N1. It is thus possible to forestall a rise in the direct-current output voltage Vo before static overcurrent protection operation (Vfb>Vth105) becomes active.

The overboosting suppressor 101e includes a filter e1, D flip-flops e2 and e3, an inverter e4, AND gates e5 and e6, an NMOSFET e7, and a resistor e8. During the start-up of the switching power supply 1, the overboosting suppressor 101e discharges the error voltage Veo and thereby forcibly reduces the on-duty Don of the output transistor N1.

The filter e1 applies predetermined masking to the pulse width modulation signal PWM, and thereby generates an internal signal Se1. More specifically, while pulses with a switching period T are appearing in the pulse width modulation signal PWM, the internal signal Se1 is kept at low level. On the other hand, when the error voltage Veo becomes lower than the lower-limit value of the ramp voltage Vramp (corresponding to the discharge stop voltage, which is, for example, 0.3 V) and the pulse width modulation signal PWM is held at high level (a logic level for N1 to be off) for a predetermined mask period Tm(>T), that is, when the switching power supply 1 shifts into a burst mode (a power-saving mode for enhancing efficiency under a light-load or no-load condition by thinning out pulses in the pulse width modulation signal PWM), the internal signal Se1 is raised to high level.

The D flip-flop e2 takes in the logic level (=H all the time) of a data signal, which is fed to the data terminal of the D flip-flop e2, at the rise timing of the gain-up signal GUP, which is fed to the clock terminal of the D flip-flop e2, and latches and outputs, from the output terminal of the D flip-flop e2, the so taken-in logic level as an internal signal Se2. The D flip-flop e2 also resets the internal signal Se2 to low level when the low-voltage protection signal UVLO, which is fed to the reset terminal of the D flip-flop e2, is at low level (a logic level corresponding to UVLO operation).

The D flip-flop e3 takes in the logic level (=H all the time) of a data signal, which is fed to the data terminal of the D flip-flop e3, at the rise timing of an internal signal Se5 (an AND signal between the internal signals Se1 and Se2), which is fed to the clock terminal of the D flip-flop e3, and latches and outputs, from the output terminal of the D flip-flop e3, the so taken-in logic level as an internal signal Se3. The D flip-flop e3 also resets the internal signal Se3 to low level when the low-voltage protection signal UVLO, which is fed to the reset terminal of the D flip-flop e3, is at low level (a logic level corresponding to UVLO operation).

The inverter e4 logically inverts the internal signal Se3 and thereby generates an internal signal Se4. Accordingly, when Se3=L, Se4=H, and when Se3=H, Se4=L.

The AND gate e5 generates the AND signal between the internal signals Se1 and Se2, and outputs the AND signal as the internal signal Se5. Accordingly, when at least one of the internal signals Se1 and Se2 is at low level, the internal signal Se5 is at low level, and when the internal signals Se1 and Se2 are both at high level, the internal signal Se5 is at high level.

The AND gate e6 generates the AND signal between the gain-up signal GUP and the internal signal Se4, and outputs the AND signal as a discharge control signal DCHG. Accordingly, when Se4=H, DCHG=GUP, and when Se4=L, DCHG=L.

The drain of the NMOSFET e7 is connected via the resistor e8 to the phase compensation terminal EO (the terminal from which the error voltage Veo is output). The source and the backgate of the NMOSFET e7 are both connected to the grounded terminal. The gate of the NMOSFET e7 is fed with the discharge control signal DCHG. Accordingly, the NMOSFET e7 is on when DCHG=H, and is off when DCHG=L. So connected, the NMOSFET e7 functions as a discharge switch that discharges the error voltage Veo according to the discharge control signal DCHG.

The resistor e8 is a current limiting element (for example, 4 kΩ) that limits the discharge current passing in the NMOSFET e7 so that it will not be excessively high.

Although, in FIG. 8, for convenience of description, the overboosting suppressor 101e is shown as one of the blocks constituting the error amplifier 101, the error amplifier 101 and the overboosting suppressor 101e can be understood as circuit blocks that are independent of each other. To follow is a description of the error voltage discharge operation by the overboosting suppressor 101e and the technical significance of such operation.

Error Voltage Discharge Operation

Figure 9:
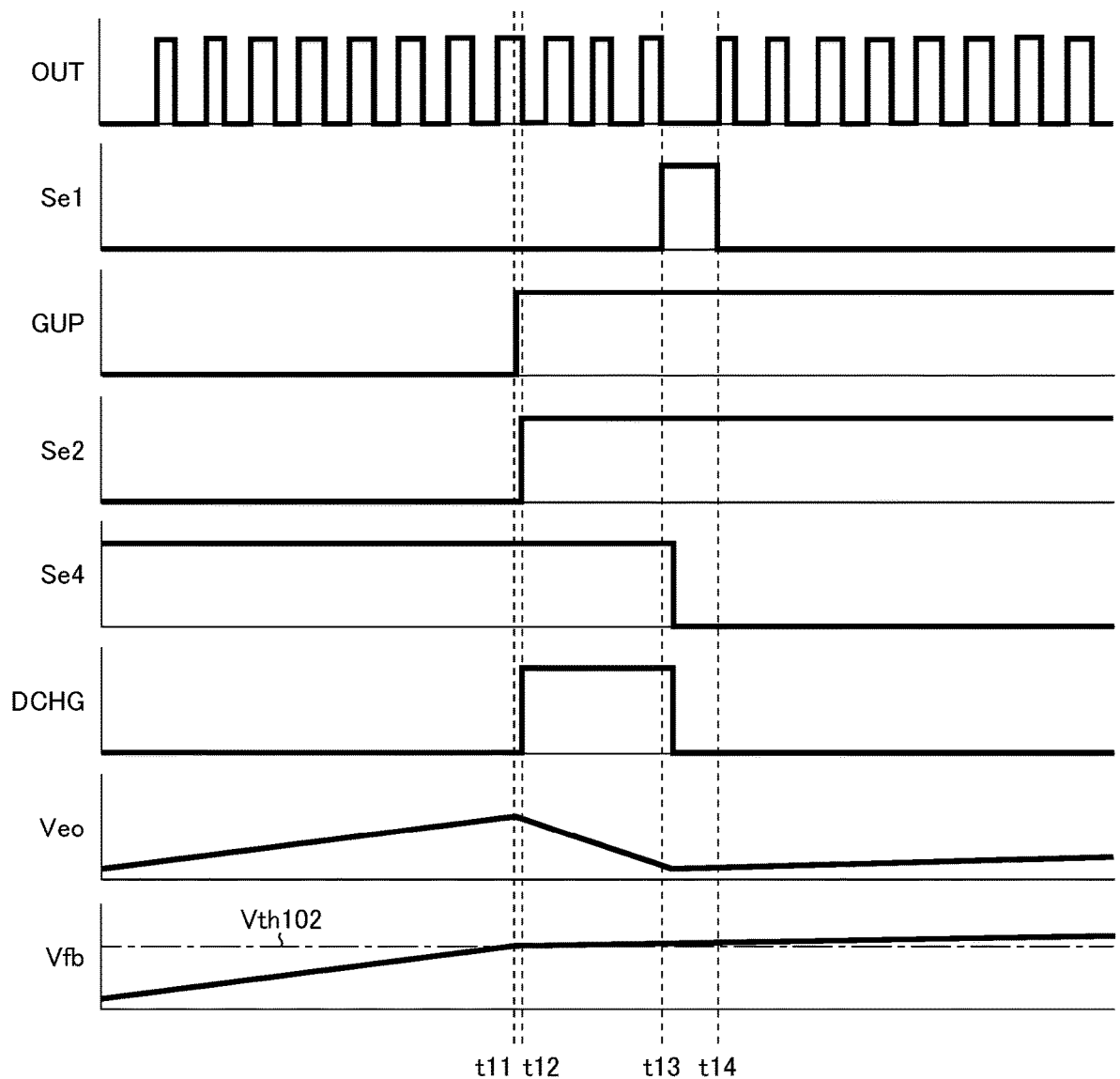
FIG. 9 is a timing chart showing one example of error voltage discharge operation.

FIG. 9 is a timing chart showing one example of the operation performed by the overboosting suppressor 101e to forcibly discharge the error voltage Veo, depicting, from top down, the terminal voltage at the output terminal OUT (corresponding to the gate signal G1 of the output transistor N1), the internal signal Se1, the gain-up signal GUP, the internal signal Se2, the internal signal Se4, the discharge control signal DCHG, the error voltage Veo, and the feedback voltage Vfb.

During the start-up of the switching power supply 1, before time point t11, the feedback voltage Vfb is lower than the threshold voltage Vth102, and thus the gain-up signal GUP is at low level (a logic level corresponding to a boosted source current). Accordingly, the current source capability of the error amplifier 101 is boosted, and thus the error voltage Veo rises comparatively sharply.

When GUP=L, DCHG=L, and thus the error voltage Veo is restrained from discharge operation. So long as the error voltage Veo is higher than the lower-limit value of the ramp voltage Vramp, and the pulse width modulation signal PWM (and hence the output terminal OUT) is pulse-driven, the internal signal Se1 is kept at low level. Neither of the D flip-flops e2 and e4 is fed with clock pulses, and thus Se2=L and Se4=H.

Thereafter, when, at time point t11, the feedback voltage Vfb becomes higher than the threshold voltage Vth102, the gain-up signal GUP rises to high level (a logic level corresponding to a regular source current). As a result, the current source capability of the error amplifier 101 is brought back to the regular state. As the gain-up signal GUP rises, at time point t12, the internal signal Se2 is latched at high level. Once the internal signal Se2 is latched at high level, it is thereafter kept at high level until the low-voltage protection signal UVLO falls to low level.

Moreover, as a result of the gain-up signal GUP and the internal signal Se4 both turning to high level, at time point t12, the discharge control signal DCHG rises to high level. Thus, the NMOSFET e7 turns on, and starts discharge operation on the error voltage Veo. That is, during the start-up of the switching power supply 1, when the feedback voltage Vfb becomes higher than the threshold voltage Vth102 (corresponding to the discharge start voltage), the overboosting suppressor 101e starts forcible discharging of the error voltage Veo.

As mentioned above, in the switching power supply 1 of this embodiment, the discharge start voltage of the overboosting suppressor 101e is set at the same value as the threshold voltage Vth102. In other words, the auxiliary source current generator 101c and the overboosting suppressor 101e share a single comparator 102, and the gain-up signal GUP is diverted as the discharge start trigger signal for the error voltage Veo. With this configuration, the overboosting suppressor 101e can be introduced with no unnecessary increase in the chip size of the controller IC 100.

Thereafter, the discharging of the error voltage Veo proceeds and, when, at time point t13, the error voltage Veo becomes lower than the lower-limit value of the ramp voltage Vramp (corresponding to the discharge stop voltage), the pulse width modulation signal PWM (and hence the output terminal OUT) stops being pulse-driven, and thus the internal signal Se1 rises to high level. As a result, the internal signal Se5 rises to high level, and the internal signal Se3 is latched at low level; thus, the internal signal Se4 falls to low level.

At this point, since Se4=L, the discharge control signal DCHG falls to low level; thus the NMOSFET e7 turns off, and stops discharge operation on the error voltage Veo. That is, when the error voltage Veo becomes lower than a predetermined discharge stop voltage, which means, for example in terms of this embodiment where the discharge stop voltage is set at the lower-limit value of the ramp voltage Vramp, when the pulse width modulation signal PWM is held at high level (a logic level for N1 to be off), the overboosting suppressor 101e stops forcible discharging of the error voltage Veo. Thus, after time point t13, the error voltage Veo starts back to increase.

Thereafter, when, at time point t14, the error voltage Veo becomes higher than the lower-limit value of the ramp voltage Vramp, the pulse width modulation signal PWM (and hence the output terminal OUT) starts to be pulse-driven again. At this point, however, the error amplifier 101 has its gain already raised, and thus the error voltage Veo increases gently starting at a sufficiently low voltage. It is thus possible to continue the starting-up of the switching power supply 1 while keeping the on-duty Don of the output transistor N1 low, and thus to suppress excessive boosting of the direct-current output voltage Vo.

Once the internal signal Se3 is latched at high level, it is thereafter kept at high level until the low-voltage protection signal UVLO falls to low level. Accordingly, the internal signal Se4 is kept at low level, and hence the discharge control signal DCHG is kept at low level (a logic level corresponding to forcible discharging being stopped). With this latching operation, the forcible discharge operation on the error voltage Veo by the overboosting suppressor 101e is activated only once during the start-up of the switching power supply 1.

Effect of Introduction of an Error Voltage Discharge Function

Figure 10:
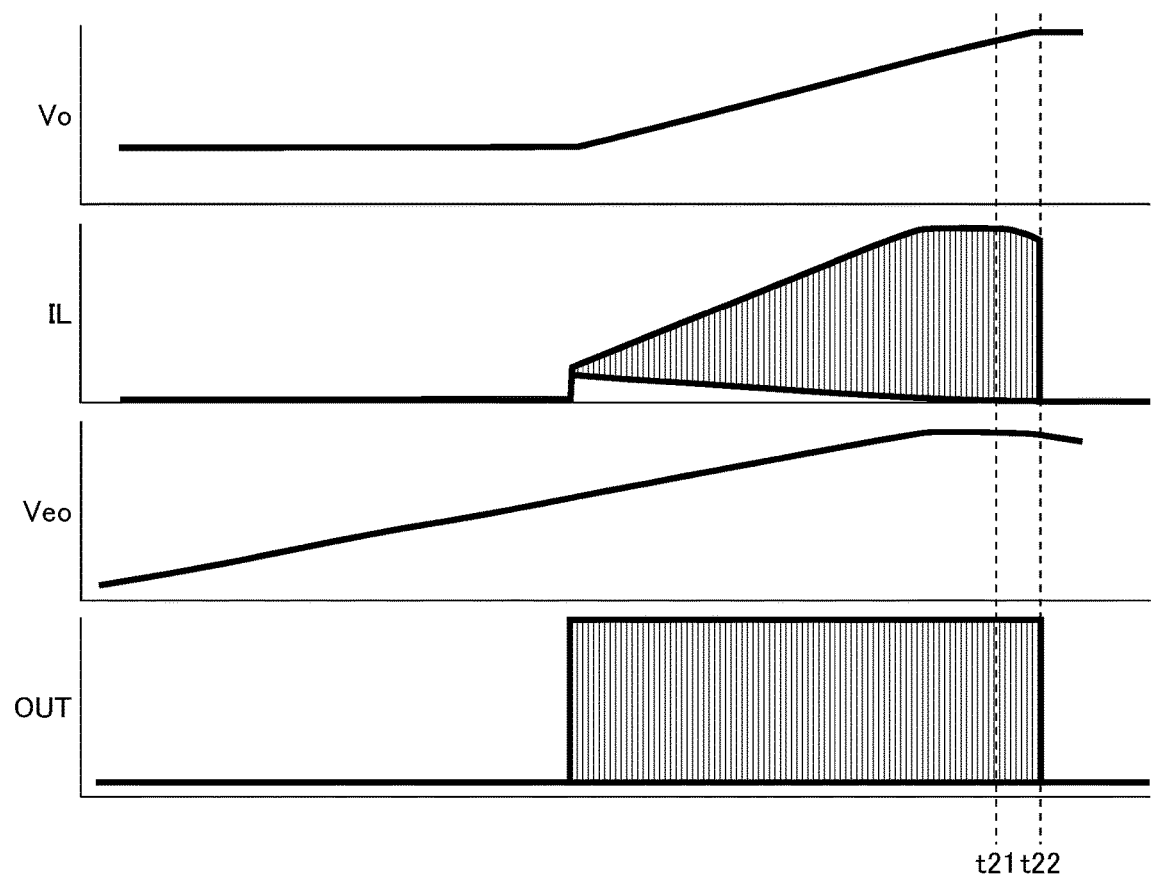
FIG. 10 is a diagram showing output behavior observed at start-up (with no error voltage discharge function introduced)

FIG. 10 is a diagram showing output behavior observed in a case where no error voltage discharge function by the overboosting suppressor 101e is introduced, depicting, from top down, the direct-current output voltage Vo, the coil current IL, the error voltage Veo, and the terminal voltage at the output terminal OUT (corresponding to the gate signal G1 of the output transistor N1).

As shown in FIG. 10, when, at time point t21, the direct-current output voltage Vo becomes higher than its target value, the error voltage Veo, which has thus far been increasing, starts to decrease. However, in a case where no error voltage discharge function by the overboosting suppressor 101e is introduced, the error voltage Veo cannot be lowered promptly, and the gate signal G1 continues to have a large pulse width; thus, the direct-current output voltage Vo goes into an overboosted state. In particular, at start-up under a light-load or no-load condition, the just-mentioned problem is notable; in the worst case, as shown to occur at time point t22, static overvoltage protection operation (SOVP operation) becomes active, causing the start-up of the switching power supply 1 to be interrupted.

Figure 11:
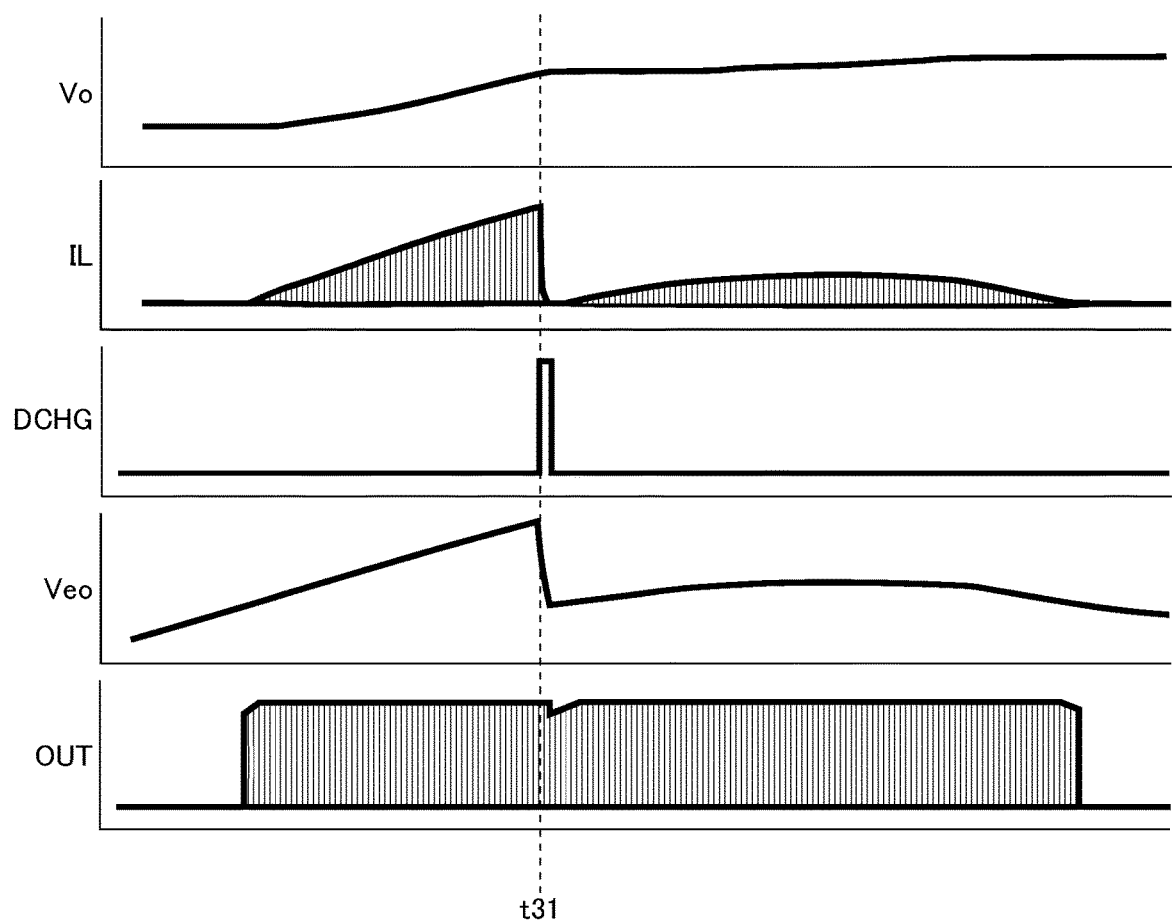
FIG. 11 is a diagram showing output behavior observed at start-up (with an error voltage discharge function introduced)

FIG. 11 is a diagram showing output behavior observed in a case where an error voltage discharge function by the overboosting suppressor 101e is introduced, depicting, from top down, the direct-current output voltage Vo, the coil current IL, the discharge control signal DCHG, the error voltage Veo, and the terminal voltage at the output terminal OUT (corresponding to the gate signal G1 of the output transistor N1).

In a case where an error voltage discharge function by the overboosting suppressor 101e is introduced, when, at time point t31, the direct-current output voltage Vo becomes higher than a predetermined threshold voltage (for example, 90% of the target value), the error voltage Veo is forcibly discharged. As a result, the on-duty Don of the output transistor N1 is lowered down to its minimum value, and then the subsequent stepping-up operation is restarted gently. Thus, unlike in FIG. 10 referred to previously, overboosting of the direct-current output voltage Vo is restrained from overboosting.

To be noted is that the overboosting suppressor 101e, which performs forcible discharging of the error voltage Veo during the start-up of the switching power supply 1, has a far smaller scale compared with common soft-start circuits (for example, one that makes the reference voltage Vref vary gently). Accordingly, the overboosting suppressor 101e can be introduced with no unnecessary increase in the chip size of the controller IC 100.

Error Amplifier (Second Embodiment)

Figure 12:
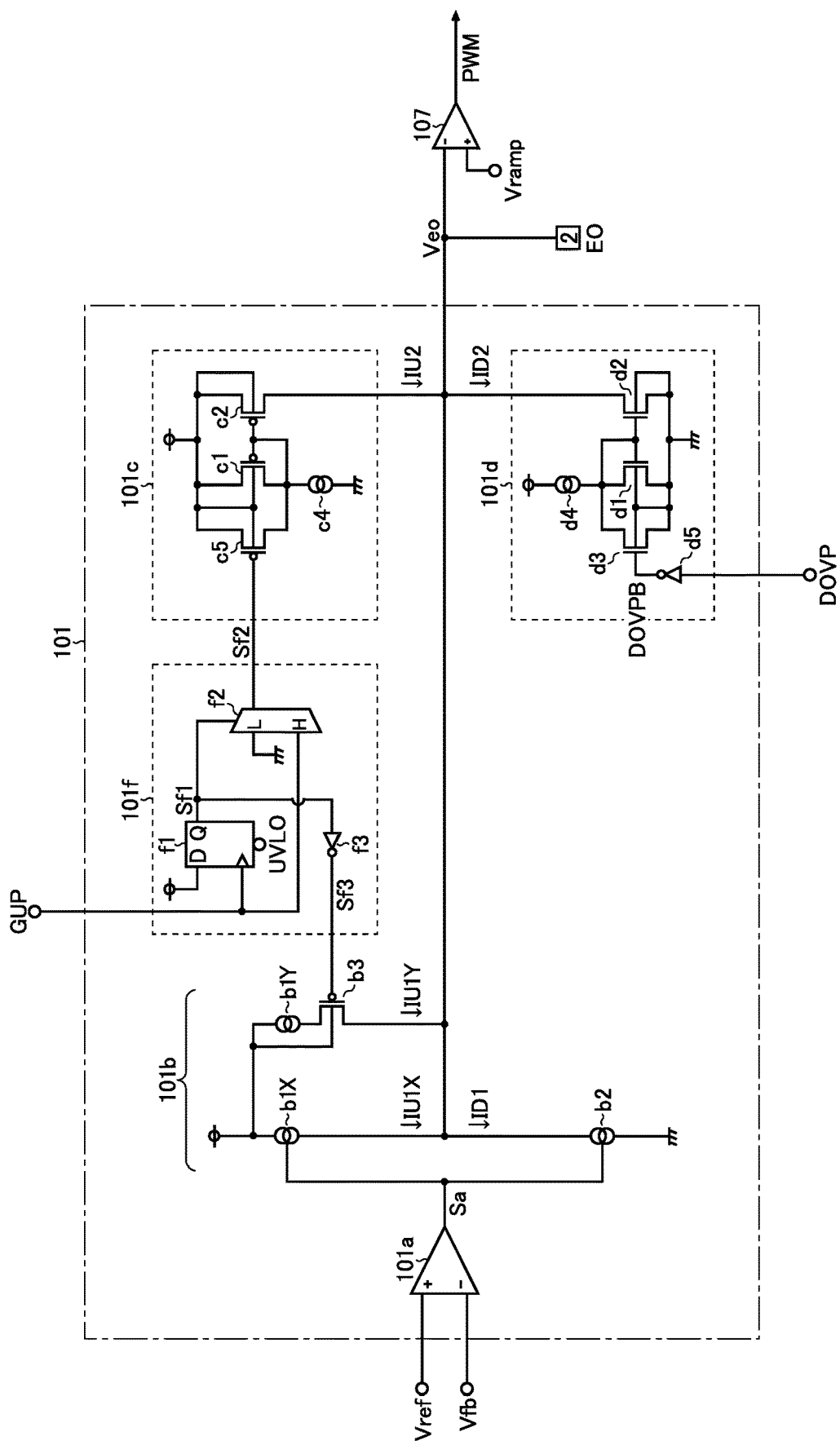
FIG. 12 is a diagram showing a second embodiment of an error amplifier.

FIG. 12 is a diagram showing a second embodiment of the error amplifier 101. While based on the first embodiment (FIG. 8) described previously, the error amplifier 101 of this embodiment includes, in place of the overboosting suppressor 101e, an overboosting suppressor 101f, and has some modifications made in the current output stage 101b and the auxiliary source current generator 101c. Accordingly, for those components which have already been described, the same reference signs as in FIG. 8 are used, and no overlapping description will be repeated; thus, the following description focuses on features unique to this embodiment.

The current output stage 101b includes, in place of the current source b1 in FIG. 8, current sources b1X and b1Y and PMOSFET b3.

The current source b1X is connected between the supply power terminal and the phase compensation terminal EO. Like the current source b1 in FIG. 8, the current source b1X generates a source current IU1X according to the current control signal Sa when it has a positive value. On the other hand, the current source b1Y is connected between the supply power terminal and the source of the PMOSFET b3. The current source b1Y generates a source current IU1Y constantly with no regard to the current control signal Sa.

The current values of the source currents IU1X and IU1Y are determined such that their sum equals the source current IU1 (for example, 30 μA at its maximum) (that is, such that IU1X=15 μA at its maximum and IU1Y=15 μA at its maximum).

The drain of the PMOSFET b3 is connected to the phase compensation terminal EO. The gate of the PMOSFET b3 is fed with an internal signal Sf3 from the overboosting suppressor 101f. The backgate of the PMOSFET b3 is connected to the supply power terminal. So connected, the PMOSFET b3 functions as a switching element that switches between a conducting state and a cut-off state the path between the current source b1Y and the phase compensation terminal EO according to the internal signal Sf3.

When Sf3=L, the PMOSFET b3 is on; thus, the path between the current source b1Y and the phase compensation terminal EO is in a conducting state. As a result, along with the source current IU1X, the source current IU1Y is passed into the phase compensation terminal EO. That is, when Sf3=L, the current source capability of the error amplifier 101 equals that in the first embodiment (FIG. 8).

On the other hand, when Sf3=H, the PMOSFET b3 is off; thus the path between the current source b1Y and the phase compensation terminal EO is in a cut-off state. As a result, the source current IU1Y ceases to be passed into the phase compensation terminal EO. That is, when Sf3=H, the current source capability of the error amplifier 101 is lower than that in the first embodiment (FIG. 8).

The auxiliary source current generator 101c includes, in place of the PMOSFET c3, a PMOSFET c5. The source and the backgate of PMOSFET c5 is connected to the supply power terminal. The drain of the PMOSFET c5 is connected to the drain of the PMOSFET c1. The gate of the PMOSFET c5 is fed with an internal signal Sf2 from the overboosting suppressor 101f. Due to the above-mentioned modifications, the drain of the PMOSFET c2 is here connected directly to the phase compensation terminal EO.

In the auxiliary source current generator 101c in this configuration example, the PMOSFET c5 functions as a switching element that switches the current mirror formed by the PMOSFETs c1 and c2 between an enabled state and a disabled state by switching the drain-source channel of the PMOSFET c1 between a conducting state and a cut-off state.

When Sf2=H, the PMOSFET c5 is off; thus, the drain-source channel of the PMOSFET c1 is in a cut-off state, and the current mirror is in an enabled state. As a result, separately from the source currents IU1X+IU1Y in the current output stage 101b, the auxiliary source current IU2 is passed into the phase compensation terminal EO, and this makes it easier for the error voltage Veo to increase.

By contrast, when Sf2=L, the PMOSFET c5 is on; thus, the drain-source channel of the PMOSFET c1 is in a conducting state, and the current mirror is in a disabled state. As a result, the auxiliary source current IU2 ceases to be passed into the phase compensation terminal EO.

The overboosting suppressor 101f includes a D flip-flop f1, a selector f2, and an inverter f3. Only during the start-up of the switching power supply 1 does the overboosting suppressor 101f keep the gain of the error amplifier 101 forcibly lower than during regular operation until the feedback voltage Vfb becomes higher than the GUP threshold voltage Vth102 Vref).

The D flip-flop f1 takes in the logic level (=H all the time) of a data signal, which is fed to the data terminal of the D flip-flop f1, at the rise timing of the gain-up signal GUP, which is fed to the clock terminal of the D flip-flop f1, and latches and outputs, from the output terminal of the D flip-flop f1, the so taken-in logic level as an internal signal Sf1. The D flip-flop f1 also resets the internal signal Sf1 to low level when the low-voltage protection signal UVLO, which is fed to the reset terminal of the D flip-flop f1, is at low level (a logic level corresponding to UVLO operation).

The selector f2 selects either the gain-up signal GUP or a fixed low-level signal (for example, GND) according to the internal signal Sf1, and outputs the selected signal as the internal signal Sf2. More specifically, when Sf1=H, Sf2=GUP, and when Sf1=L, Sf2=L fixedly.

The inverter f3 logically inverts the internal signal Sf1 and thereby generates the internal signal Sf3. Accordingly, when Sf1=L, Sf3=H, and when Sf1=H, Sf3=L.

In a case where the overboosting suppressor 101f configured as described above is introduced, at the start-up of the switching power supply 1, while the feedback voltage Vfb stays lower than the threshold voltage Vth102 (GUP=L), Sf1=L, Sf2=L, and Sf3=H. Accordingly, the current output stage 101b keeps the PMOSFET b3 off so as to output only the source current IU1X, and the auxiliary source current generator 101c keeps the current mirror formed by the PMOSFETs c1 and c2 in a disabled state so as to suspend generating the auxiliary source current IU2. This state corresponds to a state where the gain of the error amplifier 101 is forcibly lowered than during regular operation. As a result, at the start-up of the switching power supply 1, the on-duty Don of the output transistor N1 is increased gently, and it is thus possible to suppress overboosting of the direct-current output voltage Vo.

Thereafter, the starting-up of the switching power supply 1 proceeds, and when the feedback voltage Vfb becomes higher than the threshold voltage Vth102, then GUP=H, and thus Sf1=H, Sf2=GUP, and Sf3=L. Accordingly, the current output stage 101b keeps the PMOSFET b3 on so as to output the sum of the source currents IU1X and IU1Y, and the auxiliary source current generator 101c keeps the current mirror formed by the PMOSFETs c1 and c2 in an enabled state so as to be ready to output the auxiliary source current IU2 according to the gain-up signal GUP. This state corresponds to a state where the gain of the error amplifier 101 is released from forcible lowering. Now, the subsequent output feedback control can be performed without delay.

Specifically described, the above-mentioned source current limiting operation proceeds as follows. For example, in the switching power supply 1 of this embodiment, while Vfb<Vth102, the current source capability of the error amplifier 101 is limited to 15 µA (that is, only IU1X). Thereafter, when Vfb>Vth102 holds, the current source capability of the error amplifier 101 is set back at the regular value, namely 30 µA (=IU1X+IU1Y). Thereafter, if Vfb<Vth102 holds, the current source capability of the error amplifier 101 is boosted up to 50 µA (=IU1X+IU1Y+IU2).

Once the internal signal Sf1 is latched at high level, it is thereafter kept at high level until the low-voltage protection signal UVLO falls to low level, and hence the internal signal Sf3 is kept at low level during the same period. With this latching operation, the source current limiting operation by the overboosting suppressor 101f is activated only once during the start-up of the switching power supply 1.

The overboosting suppressors 101e and 101f can be introduced not only in a PFC circuit like the one taken as an example in the embodiments described above but widely in step-up switching power supplies (and controller ICs used in them) in general. Also, the switching output stage can be of any of different insulation types (an insulating or non-insulating type).

In a case where the overboosting suppressors 101e and 101f are introduced, the auxiliary source current generator 101c and the auxiliary sink current generator 101d are not essential blocks. That is, the overboosting suppressors 101e and 101f can be introduced widely in switching power supplies that lack one or both of those blocks.

Overview

To follow is an overview of the various embodiments described thus far.

According to one aspect of what is disclosed herein, a controller IC includes: a current detection terminal for detecting a coil current passing in a switching power supply; and an on-timing setter configured to check for a ground short circuit at the current detection terminal when an output transistor turns off to generate an on-timing setting signal so as to turn on the output transistor, during normal operation, at the time point that the coil current has decreased to a zero value or a value close thereto and, during a ground short circuit, to turn on the output transistor after the lapse of a predetermined minimum off-period (a first configuration).

In the controller IC of the first configuration described above, preferably, the on-timing setter includes: a zero-current detector configured to generate a zero-current detection signal by comparing the terminal voltage at the current detection terminal or a voltage commensurate with it with a predetermined threshold voltage; a timer configured to count the minimum off-period after the output transistor is turned off to generate a timer output signal; and a selector configured to output one of the zero-current detection signal or a delayed signal of it and the timer output signal as the on-timing setting signal according to the result of the check for a ground short circuit (a second configuration).

In the controller IC of the second configuration described above, preferably, the selector includes a D flip-flop that latches the zero-current detection signal when the output transistor turns off, and the selector is configured to select one of the zero-current detection signal or the delayed signal of it and the timer output signal according to the latched output signal of the D flip-flop (a third configuration).

In the controller IC of the second or third configuration described above, preferably, the on-timing setter includes a signal retarder configured to generate and output to the selector the delayed signal of the zero-current detection signal (a fourth configuration).

In the controller IC of the fourth configuration described above, preferably, the signal retarder includes: a capacitor; a current source configured to generate a charge current for the capacitor; a discharge switch configured to discharge the capacitor according to the zero-current detection signal; and an inverter configured to generate the delayed signal from the charge voltage across the capacitor (a fifth configuration).

In the controller IC of any of the second to fifth configurations described above, preferably, the timer includes: a capacitor; a current source configured to generate a charge current for the capacitor; a discharge switch configured to discharge the capacitor during the on-period of the output transistor; and a buffer configured to generate the timer output signal from the charge voltage across the capacitor (a sixth configuration).

In the controller IC of any of the second to sixth configurations described above, preferably, the zero-current detector includes: a first resistor voltage divider connected between a terminal to which a regulated voltage is applied and the current detection terminal and configured to generate a divided terminal voltage shifted from the terminal voltage at the current detection terminal toward the regulated voltage; a second resistor voltage divider connected between the terminal to which the regulated voltage is applied and a grounded terminal and configured to divide the regulated voltage to generate the threshold voltage; and a comparator configured to compare the divided terminal voltage with the threshold voltage to generate the zero-current detection signal (a seventh configuration).

In the controller IC of any of the first to seventh configurations described above, preferably, an error amplifier configured to generate an error voltage commensurate with the difference between the output voltage of the switching power supply or a division voltage of it and a predetermined reference voltage; an oscillator configured to generate a ramp voltage; a comparator configured to compare the error voltage with the ramp voltage to generate an off-timing setting signal; an RS flip-flop configured to generate a switching control signal based on the on-timing setting signal and the off-timing setting signal; and a driver configured to drive the output transistor according to the switching control signal (an eighth configuration).

According to another aspect of what is disclosed herein, a switching power supply includes: a switching output stage configured to generate an output voltage from an input voltage by use of the output transistor; and the controller IC of any of the first to eighth configurations described above (a ninth configuration).

In the switching power supply of the ninth configuration described above, preferably, the switching power supply functions as a power factor correction circuit (a tenth configuration).

According to yet another aspect of what is disclosed herein, a controller IC that acts as a controlling agent for an output transistor included in a step-up switching power supply includes: an overboosting suppressor configured to forcibly reduce the on-duty of the output transistor during the start-up of the switching power supply (an eleventh configuration).

In the controller IC of the eleventh configuration described above, preferably, there are further provided an error amplifier configured to generate an error voltage commensurate with the difference between the output voltage of the switching power supply or a feedback voltage commensurate with it and a predetermined reference voltage; and a main comparator configured to compare the error voltage with a ramp voltage to generate a pulse width modulation signal for setting the off-timing of the output transistor, and the overboosting suppressor is configured to start forcible discharging of the error voltage when, during the start-up of the switching power supply, the output voltage or the feedback voltage becomes higher than a discharge start voltage (a twelfth configuration).

In the controller IC of the twelfth configuration described above, preferably, the overboosting suppressor is configured to stop forcible discharging of the error voltage when the error voltage becomes lower than a discharge stop voltage (a thirteenth configuration).

In the controller IC of the twelfth or thirteenth configuration described above, preferably, the overboosting suppressor is configured to stop forcible discharging of the error voltage when the pulse width modulation signal is fixed at a logic level corresponding to the off-period (a fourteenth configuration).

In the controller IC of any of the twelfth to fourteenth configurations described above, preferably, the error amplifier includes: a differential input stage configured to generate a current control signal commensurate with the difference between the output voltage or the feedback voltage and the reference voltage; a current output stage configured to generate, according to the current control signal, either a source current that is passed into a terminal from which the error voltage is output or a sink current that is drawn out of the terminal from which the error voltage is output; and an auxiliary source current generator configured to generate an auxiliary source current when the output voltage or the feedback voltage is lower than a first threshold voltage lower than the reference voltage (a fifteenth configuration).

In the controller IC of the fifteenth configuration described above, preferably, the discharge start voltage equals the first threshold voltage (a sixteenth configuration).

In the controller IC of the fifteenth or sixteenth configuration described above, preferably, the error amplifier further includes an auxiliary sink current generator configured to generate an auxiliary sink current when the output voltage or the feedback voltage is higher than a second threshold voltage higher than the reference voltage (a seventeenth configuration).

According to still another aspect of what is disclosed herein, a controller IC that acts as a controlling agent for an output transistor included in a step-up switching power supply includes: an error amplifier configured to generate an error voltage commensurate with the difference between the output voltage of the switching power supply or a feedback voltage commensurate with it and a predetermined reference voltage; a main comparator configured to compare the error voltage with a ramp voltage to generate a pulse width modulation signal for setting the off-timing of the output transistor; and an overboosting suppressor configured to forcibly keep, only during the start-up of the switching power supply, the gain of the error amplifier lower than during regular operation until the output voltage or the feedback voltage becomes higher than a predetermined threshold voltage lower than the reference voltage (an eighteenth configuration).

According to a further aspect of what is disclosed herein, a switching power supply includes: a switching output stage configured to generate an output voltage from an input voltage by use of the output transistor; and the controller IC of any the eleventh to eighteenth configurations described above (a nineteenth configuration).

In the switching power supply of the nineteenth configuration described above, preferably, the switching power supply functions as a power factor correction circuit (a twentieth configuration).

Other Modifications

The various technical features disclosed herein may be implemented in any other manner than as in the embodiments described above, and allow for many modifications without departing from the spirit of the present invention. For example, as necessary, bipolar transistors and MOS field-effect transistors can be interchanged, and the logic levels of various signals can be inverted. That is, the embodiments descried above should be understood to be in every aspect illustrative and not restrictive. The technical scope of the present invention is defined not by the description of the embodiments given above but by the appended claims, and should be understood to encompass any modifications made in the sense and scope equivalent to those of the claims.

INDUSTRIAL APPLICABILITY

The invention disclosed herein finds application in, for example, critical-mode PFC controller ICs.

What is claimed is:

1. A controller IC, comprising:
a current detection terminal for detecting a coil current passing in a switching power supply; and
an on-timing setter configured to check for a ground short circuit at the current detection terminal when an output transistor turns off to generate an on-timing setting signal so as to turn on the output transistor,
during normal operation, at a time point that the coil current has decreased to a zero value or a value close thereto and,
during the ground short circuit, after lapse of a predetermined minimum off-period, wherein
the on-timing setter includes:
a zero-current detector configured to generate a zero-current detection signal by comparing a terminal voltage at the current detection terminal or a voltage commensurate therewith with a predetermined threshold voltage;
a timer configured to count the minimum off-period after the output transistor is turned off to generate a timer output signal; and
a selector configured to output one of the zero-current detection signal or a delayed signal thereof and the timer output signal as the on-timing setting signal according to a result of the check for the ground short circuit.

2. The controller IC according to claim 1, wherein
the selector includes a D flip-flop that latches the zero-current detection signal when the output transistor turns off, and
the selector is configured to select one of the zero-current detection signal or the delayed signal thereof and the timer output signal according to a latched output signal of the D flip-flop.

3. The controller IC according to claim 1, wherein
the on-timing setter includes a signal retarder configured to generate and output to the selector the delayed signal of the zero-current detection signal.

4. The controller IC according to claim 3, wherein
the signal retarder includes:
a capacitor;
a current source configured to generate a charge current for the capacitor;
a discharge switch configured to discharge the capacitor according to the zero-current detection signal; and
an inverter configured to generate the delayed signal from a charge voltage across the capacitor.

5. The controller IC according to claim 1, wherein
the timer includes:
a capacitor;
a current source configured to generate a charge current for the capacitor;
a discharge switch configured to discharge the capacitor during an on-period of the output transistor; and
a buffer configured to generate the timer output signal from a charge voltage across the capacitor.

6. The controller IC according to claim 1, wherein
the zero-current detector includes:
a first resistor voltage divider
connected between a terminal to which a regulated voltage is applied and the current detection terminal and
configured to generate a divided terminal voltage shifted from the terminal voltage at the current detection terminal toward the regulated voltage;
a second resistor voltage divider
connected between the terminal to which the regulated voltage is applied and a grounded terminal and
configured to divide the regulated voltage to generate the threshold voltage; and
a comparator configured to compare the divided terminal voltage with the threshold voltage to generate the zero-current detection signal.

7. The controller IC according to claim 1, further comprising:
an error amplifier configured to generate an error voltage commensurate with a difference between an output voltage of the switching power supply or a division voltage thereof and a predetermined reference voltage;
an oscillator configured to generate a ramp voltage;
a comparator configured to compare the error voltage with the ramp voltage to generate an off-timing setting signal;
an RS flip-flop configured to generate a switching control signal based on the on-timing setting signal and the off-timing setting signal; and
a driver configured to drive the output transistor according to the switching control signal.

8. A switching power supply, comprising:
a switching output stage configured to generate an output voltage from an input voltage by use of the output transistor; and
the controller IC according to claim 1.

9. The switching power supply according to claim 8, wherein the switching power supply functions as a power factor correction circuit.

* * * * *